(12) United States Patent
Kim et al.

(10) Patent No.: US 7,098,480 B2
(45) Date of Patent: Aug. 29, 2006

(54) THIN FILM TRANSISTOR ARRAY PANEL AND A METHOD FOR MANUFACTURING THE SAME

(75) Inventors: Dong-Gyu Kim, Kyungki-do (KR); Jong-Soo Yoon, Choongchungnam-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 74 days.

(21) Appl. No.: 10/273,298

(22) Filed: Oct. 18, 2002

(65) Prior Publication Data

US 2003/0085404 A1 May 8, 2003

Related U.S. Application Data

(63) Continuation of application No. 09/558,647, filed on Apr. 26, 2000, now Pat. No. 6,759,281.

(30) Foreign Application Priority Data

| Apr. 26, 1999 | (KR) | ............... | 1999-14896 |
| Apr. 26, 1999 | (KR) | ............... | 1999-14898 |
| Apr. 14, 2000 | (KR) | ............... | 2000-19712 |

(51) Int. Cl.
 *H01L 29/00* (2006.01)
(52) U.S. Cl. ............... 257/72; 257/59; 257/347
(58) Field of Classification Search .............. 257/59, 257/72, 347; 349/43
 See application file for complete search history.

(56) References Cited

U.S. PATENT DOCUMENTS 6,022,753 A    2/2000  Park et al.

(Continued)

FOREIGN PATENT DOCUMENTS

| JP | 08-339974 | 12/1996 |
| JP | 09-90415 | 4/1997 |
| JP | 11-153809 | 6/1999 |
| JP | 2000-66240 | 3/2000 |

OTHER PUBLICATIONS

Patent Abstracts of Japan, Publication No. 1996-339974, Dec. 24, 1996, 1 p.

(Continued)

*Primary Examiner*—Fetsum Abraham

(57) ABSTRACT

Disclosed is a simplified method for manufacturing a liquid crystal display. A gate wire including a gate line, a gate pad, and a gate electrode are formed on a substrate. A gate insulating layer, a semiconductor layer, and an ohmic contact layer are sequentially deposited, and a photoresist layer is coated thereon. The photoresist layer is exposed to light through a mask and developed to form a photoresist pattern. At this time, a first portion of the photoresist pattern which is located between the source electrode and the drain electrode is thinner than a second portion which is located on the data wire, and the photoresist layer is totally removed on other parts. The thin portion is made by controlling the amount of irradiating light or by a reflow process to form a thin portion, and the amount of light is controlled by using a mask that has a slit, a small pattern smaller than the resolution of the exposure device, or a partially transparent layer. Next, the exposed portions of conductor layer are removed by wet etch or dry etch, and thereby the underlying ohmic contact layer is exposed. Then the exposed ohmic contact layer and the underlying semiconductor layer are removed by dry etching along with the first portion of the photoresist layer. The residue of the photoresist layer is removed by ashing. Source/drain electrodes are separated by removing the portion of the conductor layer at the channel and the underlying ohmic contact layer pattern. Then, the second portion of the photoresist layer is removed, and red, green, and blue color filters, a pixel electrode, a redundant gate pad, and a redundant data pad are formed.

25 Claims, 41 Drawing Sheets

U.S. PATENT DOCUMENTS

| | | |
|---|---|---|
| 6,104,462 A | 8/2000 | Kurorati et al. |
| 6,124,917 A | 9/2000 | Fujioka et al. |
| 6,130,443 A | 10/2000 | Hong et al. |
| 6,255,706 B1 * | 7/2001 | Watanabe et al. ........... 257/412 |
| 6,300,152 B1 | 10/2001 | Kim |
| 6,310,672 B1 * | 10/2001 | Koike et al. |
| 6,674,495 B1 * | 1/2004 | Hong et al. .................. 349/43 |

OTHER PUBLICATIONS

Patent Abstracts of Japan, Publication No. 1997-090415, Apr. 4, 1997, 1 p.

* cited by examiner

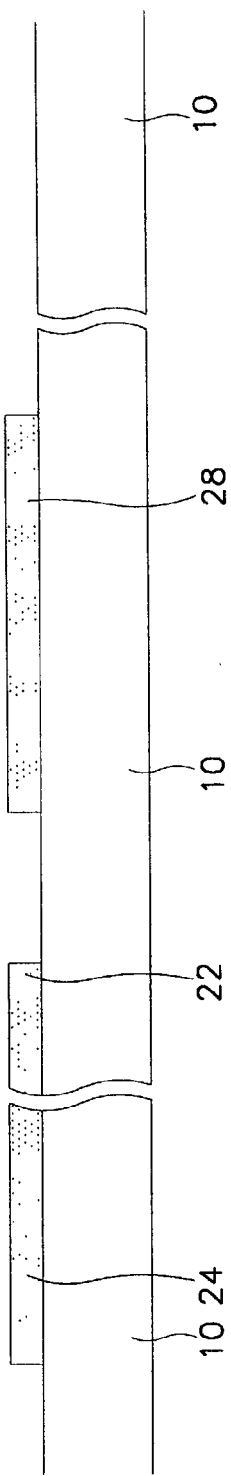

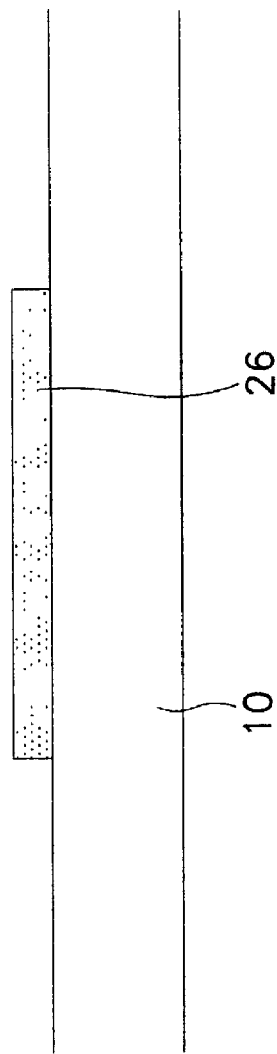

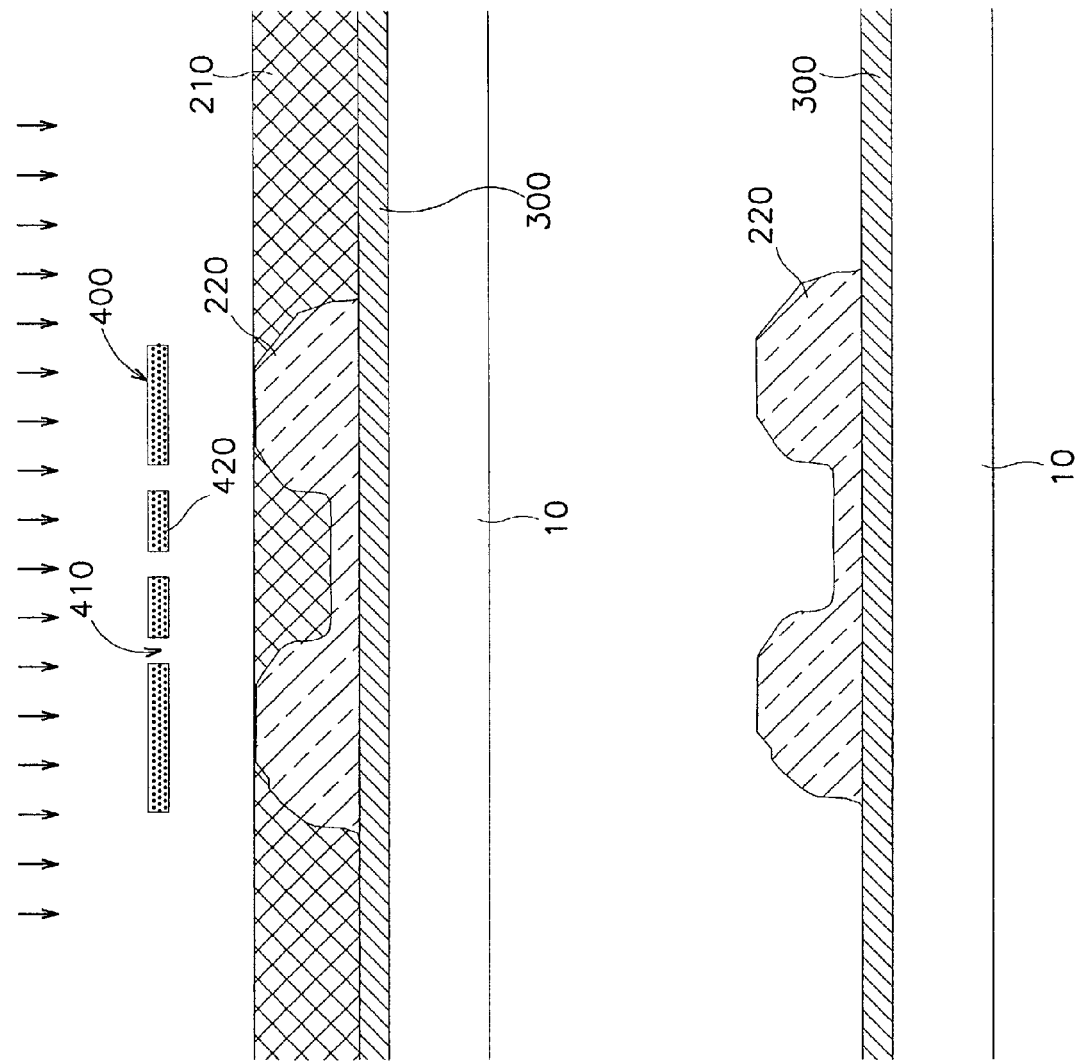

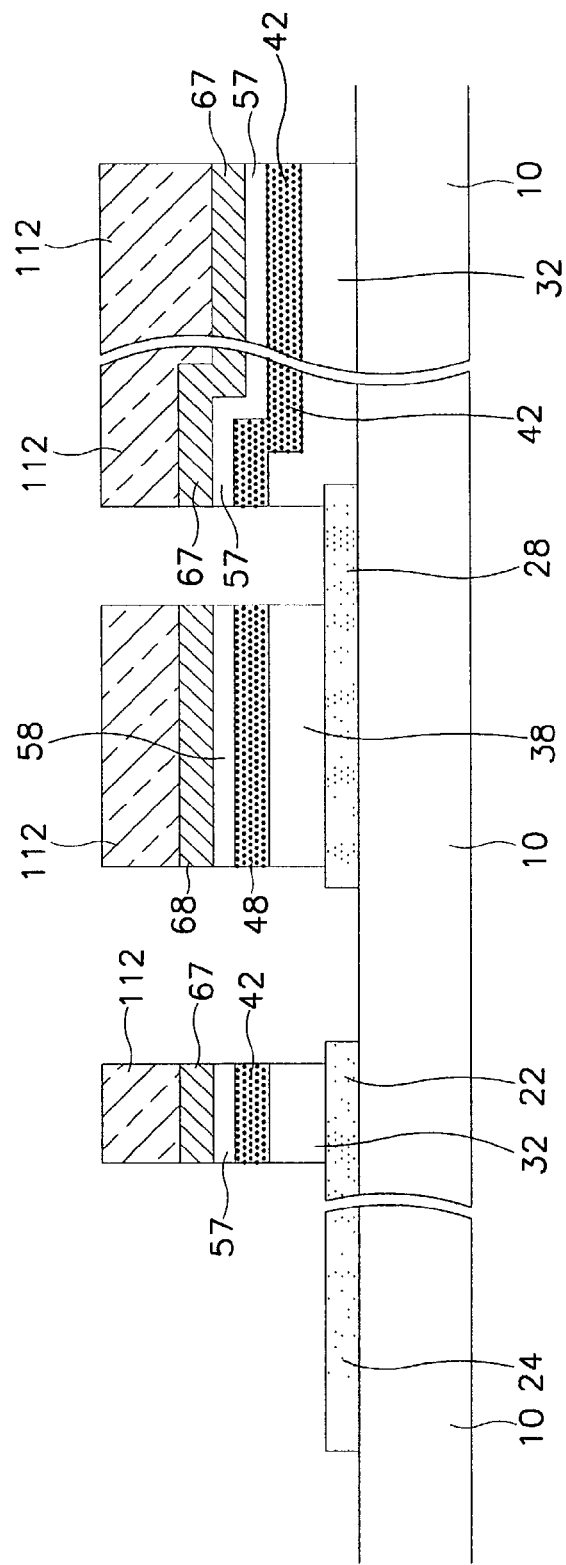

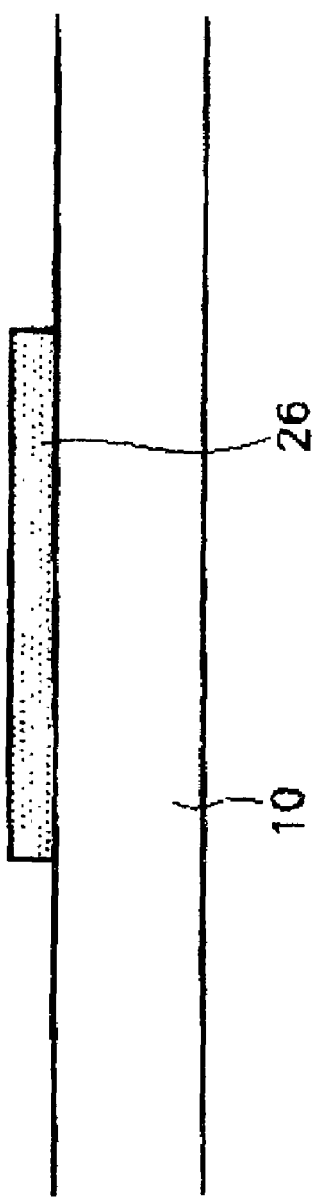

THIN FILM TRANSISTOR ARRAY PANEL AND A METHOD FOR MANUFACTURING THE SAME

The present application is a continuation of the U.S. patent application Ser. No. 09/558,647 filed Apr. 26, 2000 now U.S. Pat. No. 6,759,281.

BACKGROUND OF THE INVENTION (a) Field of the Invention

The present invention relates to thin film transistor array panels and the manufacturing methods of the same.

(b) Description of the Related Art

A liquid crystal display (LCD) is one of the most popular flat panel display (FPD). The liquid crystal display has two panels having electrodes for generating electric fields and a liquid crystal layer interposed therebetween.

The transmittance of incident light is controlled by the intensity of the electric field applied to the liquid crystal layer.

In the most widely used liquid crystal display, the field-generating electrodes are provided at both of the panels, with one of the panels having switching elements such as thin film transistors, and the other panel having color filters.

In general, a thin film transistor array panel is manufactured by a photolithography process using five or six photomasks and a color filter panel is manufactured by a photolithography process using three or four photomasks.

Since the photolithography process costs expensive, the number of the photolithography steps needs to be minimized.

SUMMARY OF THE INVENTION

It is therefore an object of the present invention to provide methods for manufacturing thin film transistor array panels for liquid crystal displays with a reduced number of masks employed in the photolithography processes.

It is another object of the present invention to simplify methods for manufacturing thin film transistor array panels for liquid crystal displays.

These and other objects are provided, according to the present invention, by forming a portion of a photoresist layer (photoresist) that is thinner than another portion between a source electrode and a drain electrode before the two electrodes are formed. Thus, the thin portion protects underlayers when some layers are etched, and is also etched along with other layers to expose its underlayer. Also, red, green, and blue color filters are used as a passivation layer covering a thin film transistor and wires. A wire may be formed of a photosensitive conductive material. The color filters may be formed of photosensitive material and screen printed or offset printed. A light blocking layer made of the color filter may be formed on the channel of the thin film transistor.

In a manufacturing method according to the present invention, a gate wire including a gate line and a gate electrode connected to the gate line is formed on an insulating substrate. A gate insulating layer pattern covering the gate wire, a semiconductor pattern, and an ohmic contact layer pattern are formed. A data wire including a data line, a source electrode and a drain electrode is formed. The source electrode and the drain electrode are made of the same layer on the ohmic contact layer and separated from each other. The data line is connected to the source electrode. Then, red, green, and blue color filters covering the data wire is formed. The color filter has a first contact hole exposing the drain electrode. A pixel electrode is formed and connected to the drain electrode through the first contact hole. Here, the source electrode and the drain electrode are separated by a photolithography process using a photoresist pattern, and the photoresist pattern has a first portion having a first thickness that is at least located between the source electrode and the drain electrode, a second portion having a second thickness thicker than the first portion, and a third portion having a third thickness thinner than the first thickness.

It is preferable that a mask used for forming the photoresist pattern has a first, a second, and a third part, and that the transmittance of the third part is higher than the first and the second parts, the transmittance of the first part is higher than the second part, the photoresist pattern is made of positive photoresist, and the mask is aligned such that the first, the second, and the third parts respectively face the first, the second, and the third portions of the photoresist pattern in an exposing step.

The first part of the mask may include a partially transparent layer, or a pattern smaller than the resolution of the exposure used in the exposing step.

BRIEF DESCRIPTION OF THE DRAWINGS

The accompanying drawings, which are incorporated in and constitute a part of the specification, illustrate an embodiment of the invention, and, together with the description, serve to explain the principle of the invention.

FIGS. 4B and 4C are cross-sectional views taken along the lines IVB–IVB' and IVC–IVC' of FIG. 4A.

FIGS. 7A, 7B, and 7C, FIGS. 8A, 8B, and 8C, and FIGS. 9A, 9B, and 9C are embodiments of a photoresist layer having various thicknesses.

FIGS. 10A, 11A, and 12A are cross-sectional views at the next step following FIG. 6B taken along the line VIB–VIB' of FIG. 6A.

FIGS. 17B and 17C are cross-sectional views taken along the lines XVIIB–XVIIB' and XVIIC–XVIIC' of FIG. 17A.

DETAILED DESCRIPTION OF THE PREFERRED EMBODIMENTS

Figure 1:
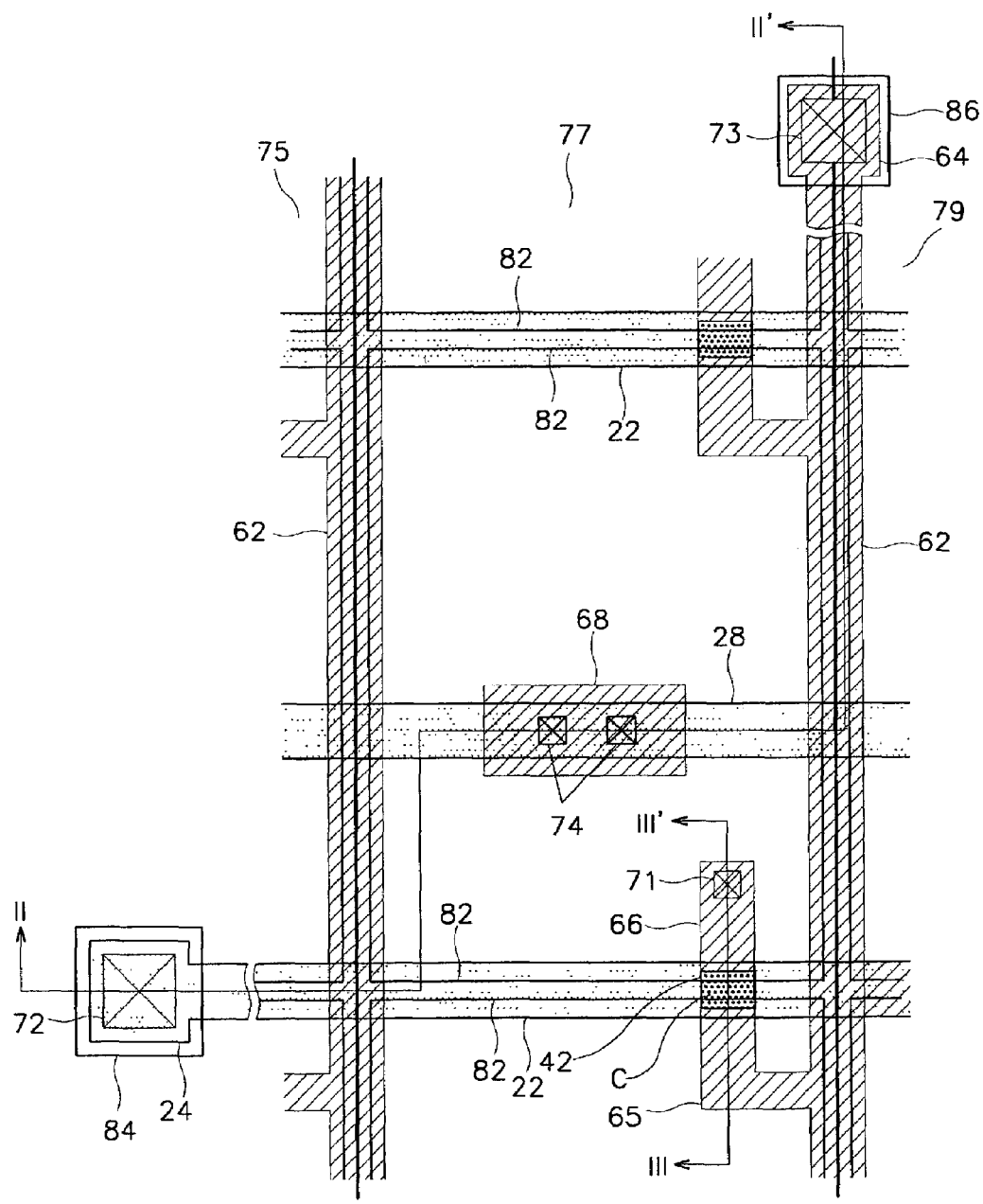
FIG. 1 is a layout view of a thin film transistor array panel for a liquid crystal display according to the first embodiment of the present invention.

The present invention now will be described more fully hereinafter with reference to the accompanying drawings, in which preferred embodiments of the invention are shown. This invention may, however, be embodied in many different forms and should not be construed as limited to the embodiments set forth herein. In the drawings, the thickness of layers and regions are exaggerated for clarity. Like numerals refer to like elements throughout. It will be understood that when an element such as a layer, region, or substrate is referred to as being "on" another element, it can be directly on the other element or intervening elements may also be present. In contrast, when an element is referred to as being "directly on" another element, there are no intervening elements present.

The number of manufacturing steps are reduced with the manufacturing method of the present invention by forming a photoresist pattern having a thinner portion between electrodes in the step of separating a source electrode from a drain electrode of the same layer, and by converting a passivation layer to red, green, and blue color filters.

Figure 2:
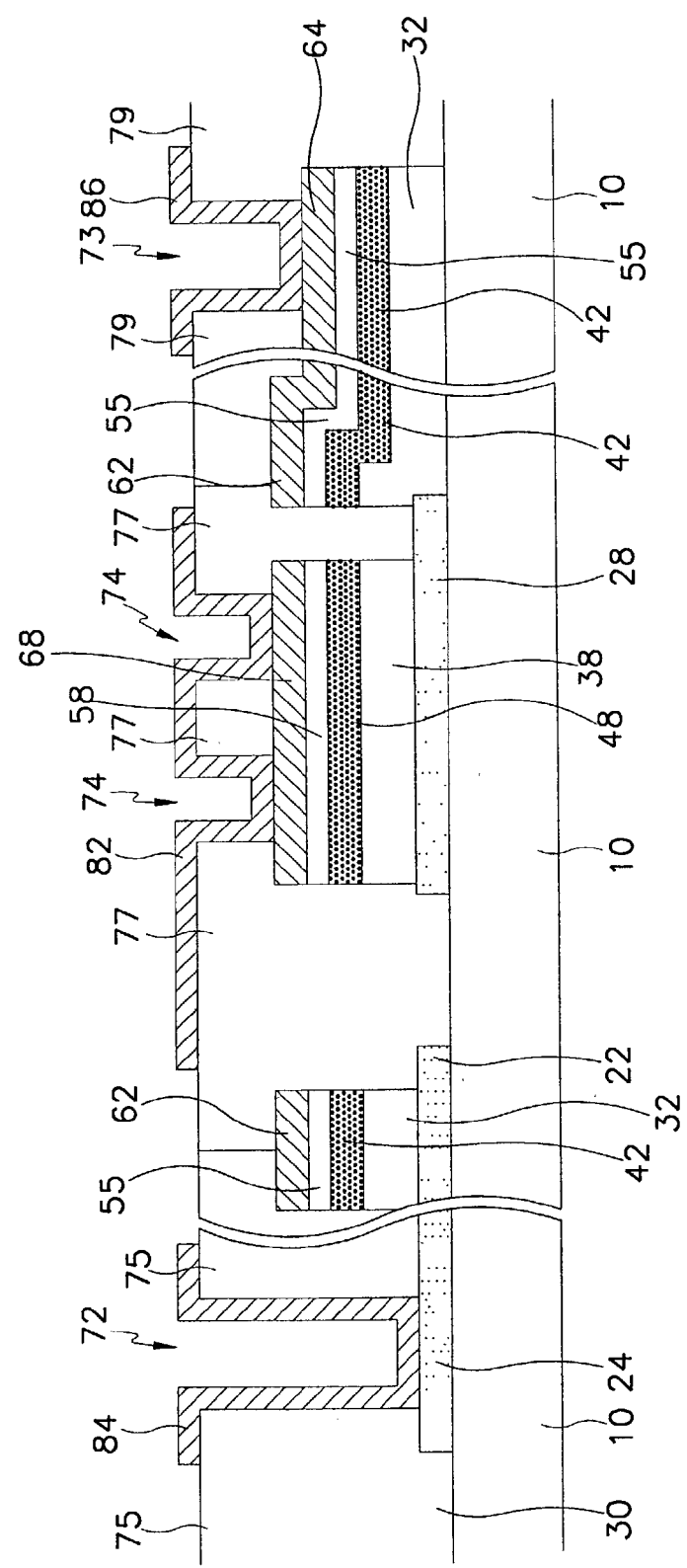
FIGS. 2 and 3 are cross-sectional views taken along lines II–II' and III–III' of FIG. 1, respectively.
Figure 3:
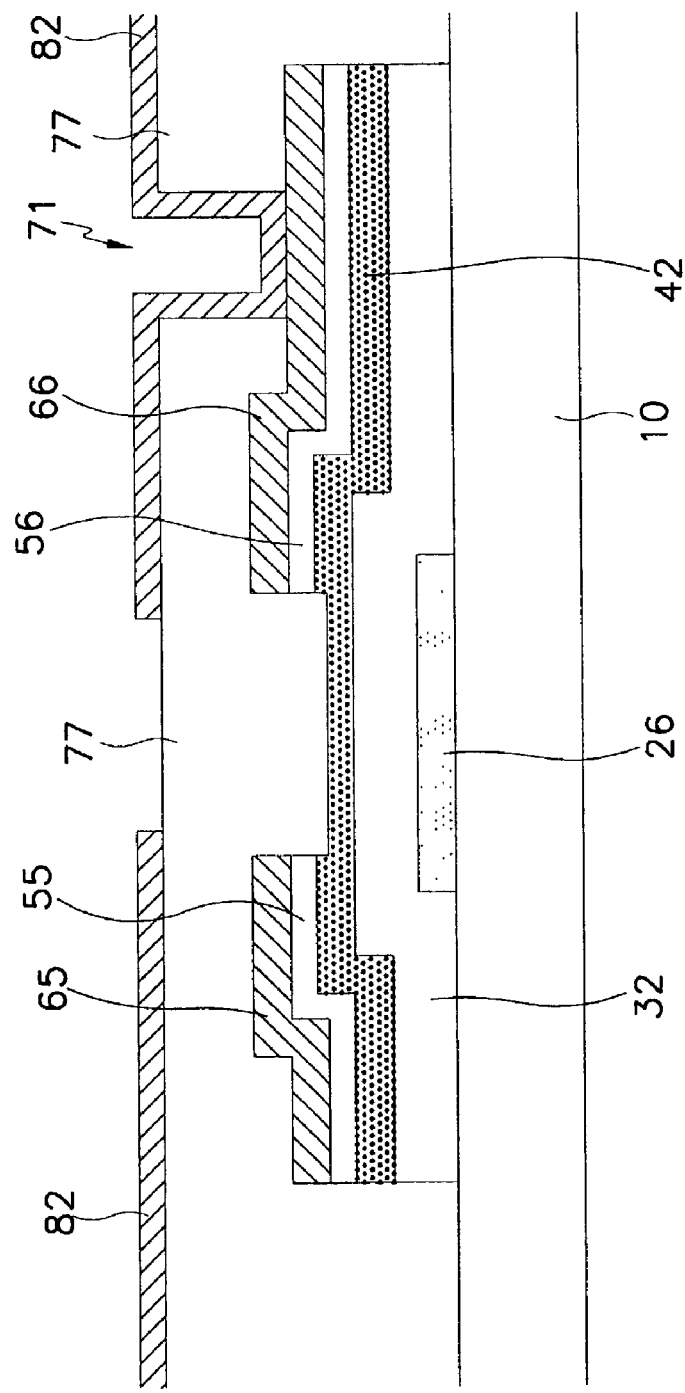

FIG. 1 is a layout view of a thin film transistor array panel for a liquid crystal display according to the first embodiment of the present invention, and FIGS. 2 and 3 are the cross-sectional views taken along lines II–II' and III–III' of FIG. 1.

Gate wires of metal or conductive material such as aluminum (Al) or aluminum alloy, molybdenum (Mo) or molybdenum-tungsten (MoW), chromium (Cr), and tantalum (Ta) are formed on an insulating substrate 10. A gate wire includes a gate line (or scanning signal line) 22 extending in the horizontal direction in FIG. 1, a gate pad 24 connected to an end of the gate line 22 and transmitting a scanning signal from an external circuit to the gate line 22, a gate electrode 26 that is a part of the thin film transistor, and a storage electrode 28 that is parallel with the gate line 22 and receives a voltage such as a common voltage applied to a common electrode (not shown) on an upper panel of the liquid crystal display. The storage electrode 28 provides the storage capacitance along with a conductor pattern 68 connected to a pixel electrode 82 that will be described later.

The liquid crystal capacitor includes the pixel electrode 82 and the common electrode. The storage electrode 28 may not be necessary if the storage capacitance between the pixel electrode 82 and the gate line 22 is sufficient.

The gate wire parts 22, 24, 26, and 28 may have either a multiple-layered structure or a single-layered structure. When the gate wire parts 22, 24, 26, and 28 form a multiple-layered structure, it is preferable that one layer is made of a material having a low resistivity and another layer is made of a material having good contacting properties with other materials. Double layers of Cr/Al (or Al alloy) and Al/Mo are examples.

Gate insulating layers 32 and 38 of silicon-nitride (SiNx) are formed on the gate wire parts 22, 24, 26, and 28, and the insulating substrate 10. The gate insulating layer pattern 32 covers the gate electrode 26.

Semiconductor patterns 42 and 48 (made of semiconductor such as hydrogenated amorphous silicon) are formed on the gate insulating layer 32 and 34. Ohmic contact layer patterns 55, 56, and 58 (made of such materials as amorphous silicon heavily doped with impurities like phosphorus) are formed on the semiconductor patterns 42 and 48.

A data wire made of conductive materials such as Mo or MoW, Cr, Al or Al alloy, and Ta is formed on the ohmic contact layer patterns 55, 56, and 58. The data wire has a data line part including a data line 62 extending in the vertical direction on FIG. 1, a data pad 64 connected to an end of data line 62 and transmitting image signals from an external circuit to the data line 62 and a source electrode 65 of a thin film transistor connected to data line 62. The data wire also includes a drain electrode 66 of the thin film transistor on the other side of the gate electrode 26 or the channel part C of a thin film transistor and is separated from the data line parts 62, 64, 65, and conductor pattern 68 used for storage capacitance located on the storage electrode 28. When the storage electrode 28 is not provided, the conductor pattern 68 is not necessary.

The data wire parts 62, 64, 65, 66, and 68 may have a multiple-layered structure like the gate wire parts 22, 24, 26, and 28. Of course, when the data wire has a multiple-layered structure, it is preferable that one layer is made of a material having a low resistivity and another is made of a material having good contacting properties.

The ohmic contact layer patterns 55, 56, and 58 reduce the contact resistance between the semiconductor patterns 42 and 48 and the corresponding data wire parts 62, 64, 65, 66, and 68, and have the same layout as the data wire parts 62, 64, 65, 66, and 68. In other words, a first ohmic contact layer portion 55 under the data line part has the same shape as the data line parts 62, 64, and 65, a second ohmic contact layer portion 56 under the drain electrode part has the same shape as the drain electrode 66, and a third ohmic contact layer portion 58 under the conductor pattern 68 has the same shape as the conductor pattern 68 for the storage capacitor. Here, the ohmic contact layer patterns 55, 56, and 58 may be extended out from the data wire parts 62, 64, 65, 66, and 68.

The semiconductor patterns 42 and 48 have the same layout as the corresponding data wire parts 62, 64, 65, 66, and 68 and the corresponding ohmic contact layer patterns 55, 56, and 58 except for the channel part C of the thin film transistor. Or, more concretely, the semiconductor portion 42, the conductor pattern 68, and the third ohmic contact layer portion 58 all have the same shape, but the semiconductor portion 42 has a shape different from the data wire and the ohmic contact layer pattern. In other words, the data line parts 62, 64, and 65, especially the source electrode 65 and the drain electrode 66, are separated from each other by the channel part C of the thin film transistor and the portions 55 and 56 of the underlying ohmic contact layer pattern are also separated from each other. But the semiconductor portion 42 is not divided into two pieces so that it traverses the channel of a thin film transistor.

Red, blue and green color filters 75, 77, and 79 are formed on the data wire parts 62, 64, 65, 66, and 68, the gate wire parts 22, 24, 26, and 28, and the substrate 10 which is not covered by the data wire parts 62, 64, 65, 66, and 68. The color filters 75, 77, 79 have contact holes 71, 72, 73, and 74 respectively exposing the drain electrode 66, the gate pad 24, the data pad 64, and the conductor pattern 68 provided for storage capacitance.

Pixel electrodes 82 that receive an image signal and generate an electric field with a common electrode of an upper panel are formed on the color filters 75, 77, and 79. The pixel electrode 82 is made of a transparent conductive material such as indium tin oxide (ITO). The pixel electrode 82 is connected to the drain electrode 66 both physically and electrically through the contact hole 71, and receives the image signal from the drain electrode. Even though the aperture ratio is increased when the pixel electrode 82 overlaps the gate lines 22 or the adjacent the data lines, these lines are not required to overlap the pixel electrode. The pixel electrode 82 is connected to the conductor pattern 68 for storage capacitance through the contact hole 74 and transmits an image signal to the conductor pattern 68.

A redundant gate pad 84 and a redundant data pad 86 respectively connected to the gate pad 24 and the data pad 64 through the contact holes 72 and 73 are formed on the gate pad 24 and the data pad 64. These redundant pads 84 and 86 are optional as they protect the pads 24 and 64 from corrosion by the ambient air and strengthen the adhesion between the external circuit and the pads 24 and 64.

A method for manufacturing a thin film transistor array panel according to an embodiment of the present invention will now be described with reference to the FIGS. 4A to 13C and FIGS. 1 to 3.

Figure 4A:
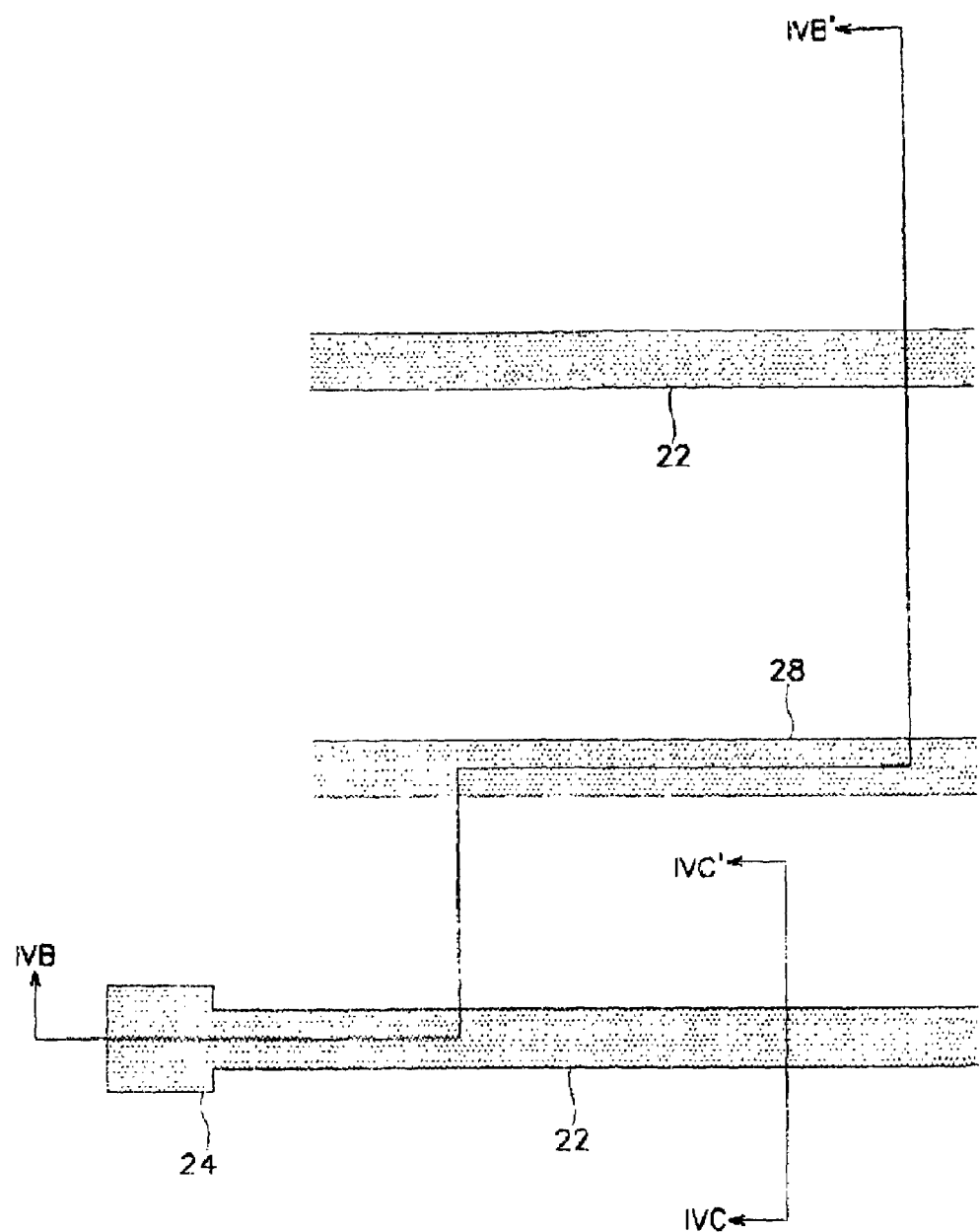
FIG. 4A is a layout view of the thin film transistor array panel according to the first embodiment of the present invention showing a first manufacturing step.

At first, as shown in FIGS. 4A to 4C, a layer of conductor, such as a metal, is deposited on a substrate 10 by such methods as sputtering to a thickness of 1,000 Å to 3,000 Å, and gate wire parts including a gate line 22, a gate pad 24, a gate electrode 26, and a storage electrode 28 are formed by dry or wet etching using a first mask.

Figure 5A:
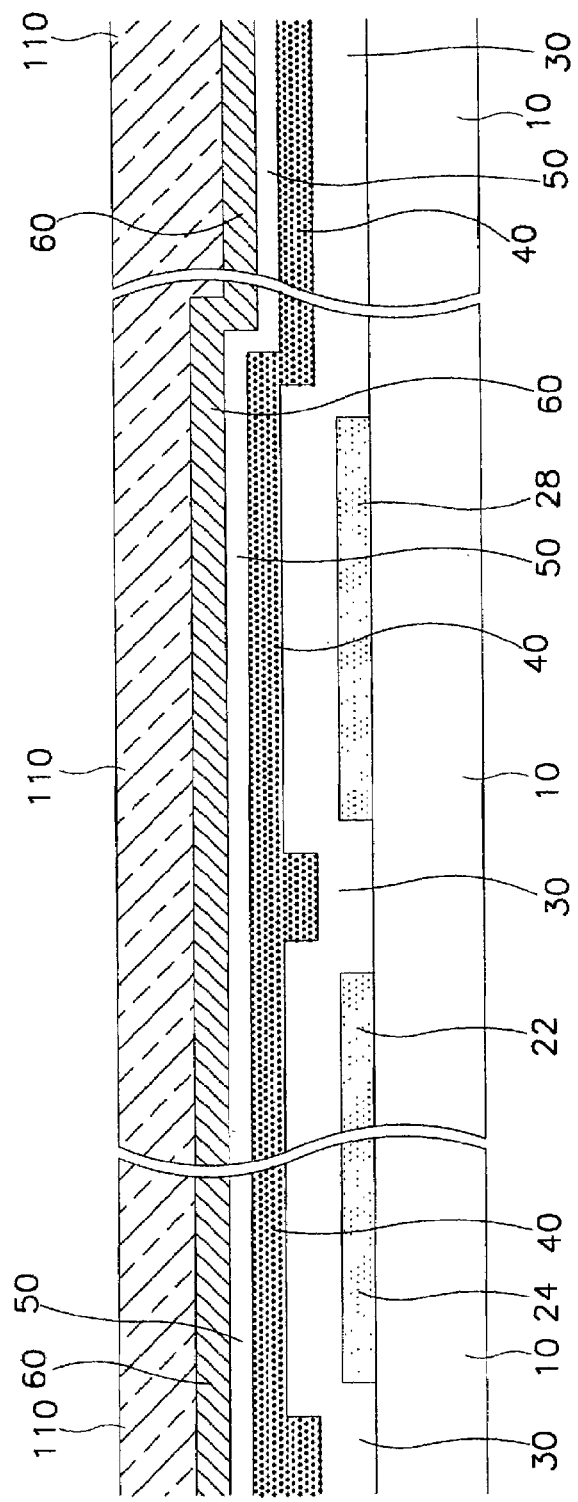
FIGS. 5A and 5B are cross-sectional views at the next step following FIGS. 4B and 4C taken along the lines IVB–IVB' and IVC–IVC' of FIG. 4A.
Figure 5B:
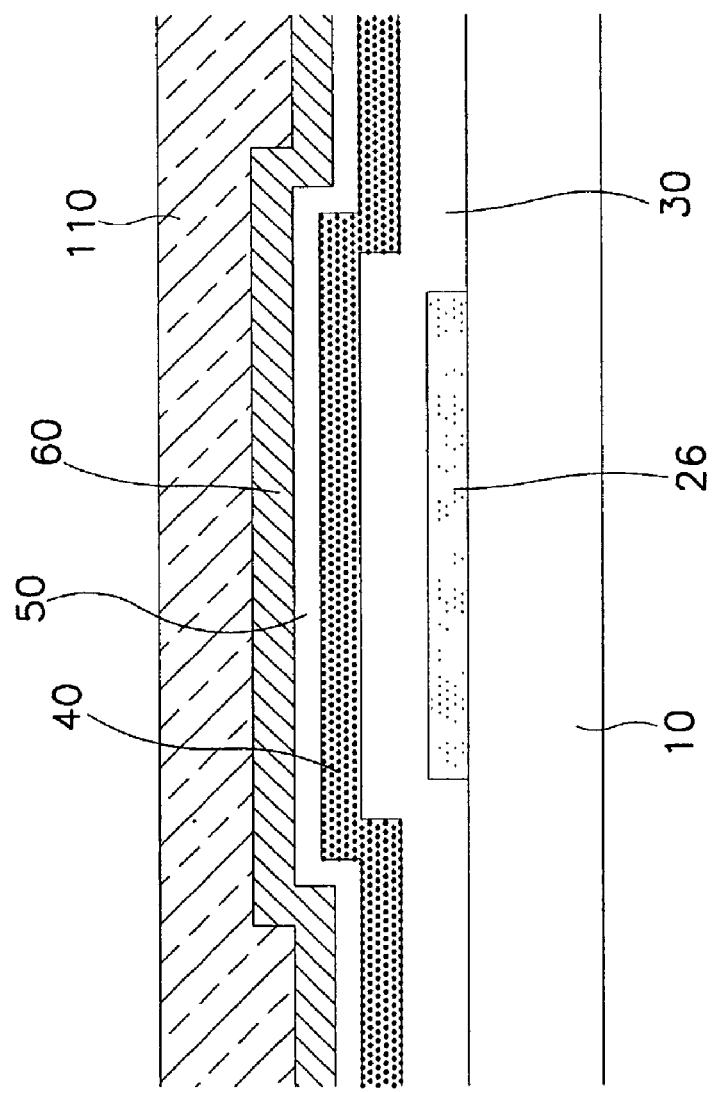

Next, as shown in FIGS. 5A and 5B, a gate insulating layer 30, a semiconductor layer 40, and an ohmic contact layer 50 are sequentially deposited to thicknesses of 1,500 Å to 5,000 Å, 500 Å to 2,000 Å, and 300 Å to 600 Å, respectively, by such methods as chemical vapor deposition (CVD). Then, a conductor layer 60, such as a metal, is deposited to a thickness of 1,500 Å to 3,000 Å by such methods as sputtering and a photoresist layer 110 having a thickness of 1 μ to 2 μ is coated on the conductive layer 60.

Figure 6A:
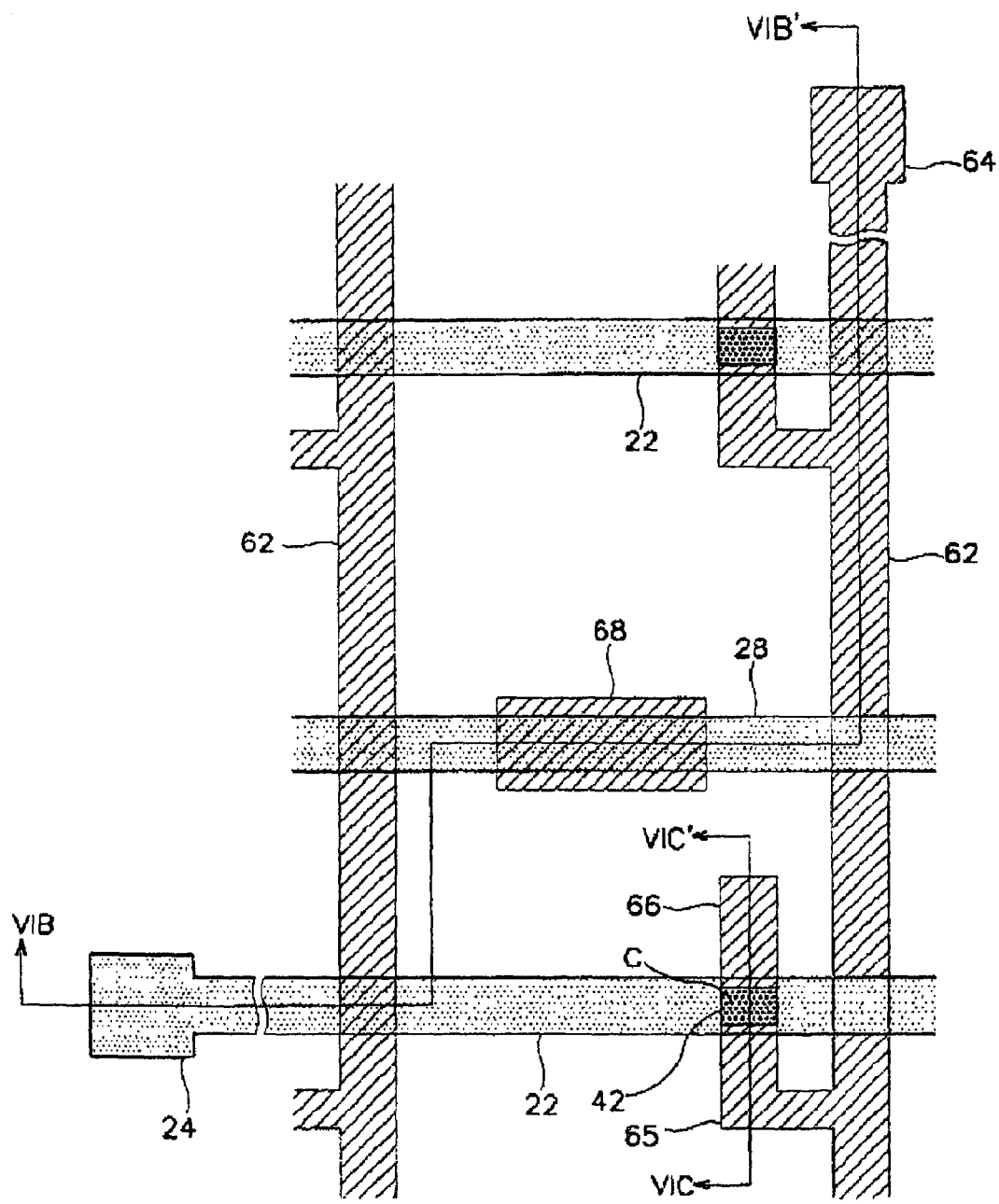
FIG. 6A is a layout view of thin film transistor array panel at the next step following FIGS. 5A and 5B.
Figure 6B:
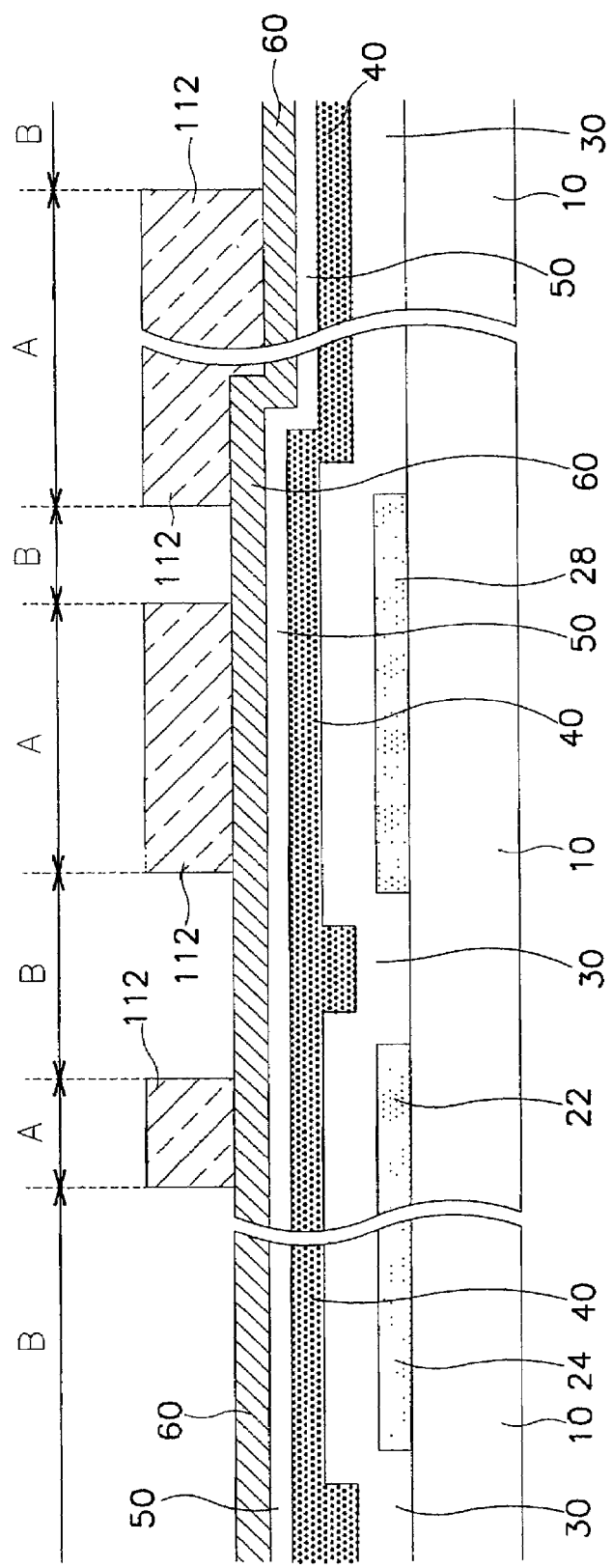
FIGS. 6B and 6C are respectively cross-sectional views taken along the lines VIB–VIB' and VIC–VIC' of FIG. 6A.
Figure 6C:
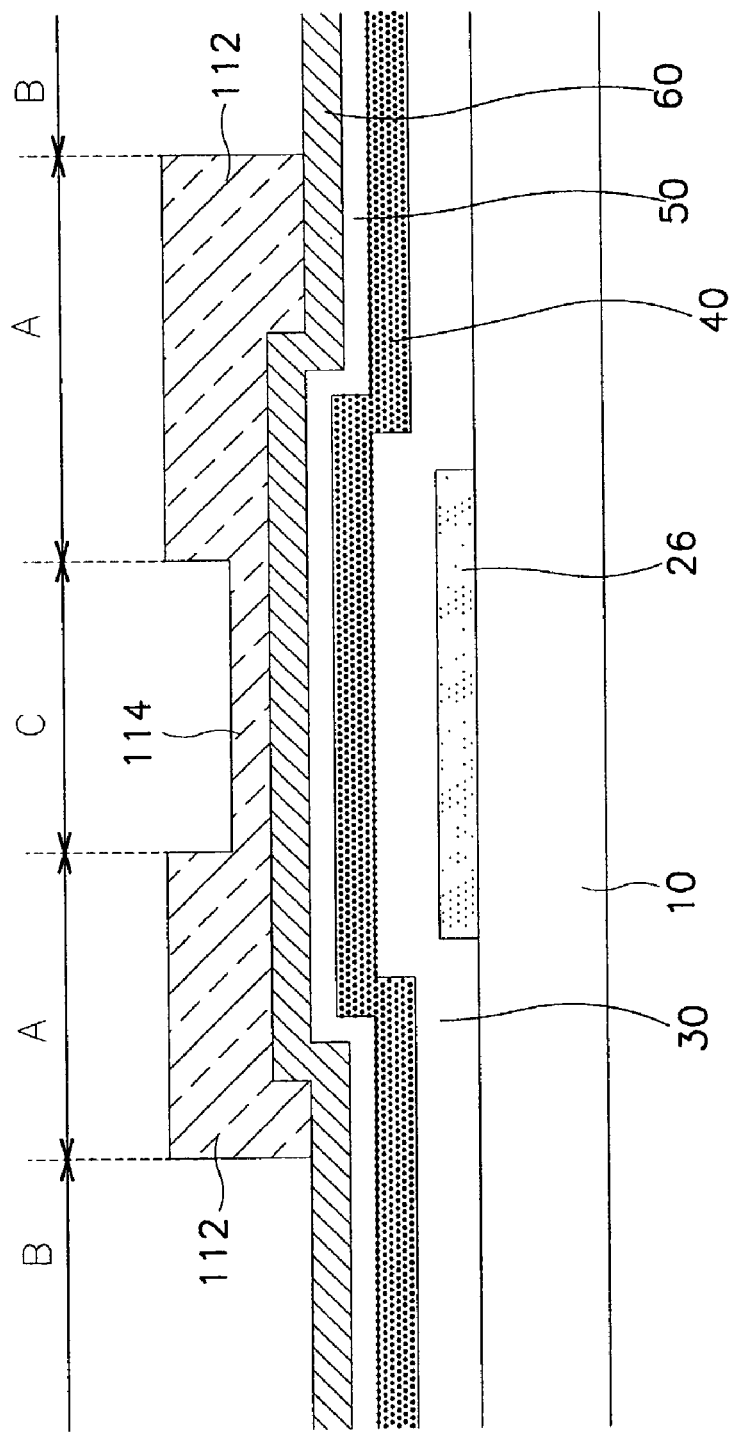

Thereafter, the photoresist layer 110 is exposed to light through a second mask and developed to form photoresist patterns 112 and 114 as shown in FIGS. 6B and 6C. At this time, the first portion 114 of the photoresist pattern located between a source electrode 65 and a drain electrode 66, i.e., a thin film transistor channel part C as shown in FIG. 6C, is thinner than the second portion 112 of photoresist pattern located over the data wire portion A where a data wire parts 62, 64, 65, 66, and 68 will be formed. Additionally, the third portion, or the remaining portion of the photoresist pattern located at portion B, is thinner than the first portion. The third portion may have a thickness that varies according to the etching method. For example, the third portion has a substantially zero thickness when using a wet etch, but the third portion may have a non-zero thickness when using a dry etch. At this time, the thickness ratio between the first portion 114 and the second portion 112 depends on the etch conditions that will be described later. However, it is preferable that the thickness of the first portion 114 is equal to or less than half of the second portion 112, or for example, less than 4,000 Å. More preferably, the thicknesses of the second portion and the first portion are respectively 16,000–19,000 Å and about 3,000 Å.

There are many methods that can make the thickness of the photoresist layer different depending on the position, and two methods using positive photoresist will be described.

Figure 7A:
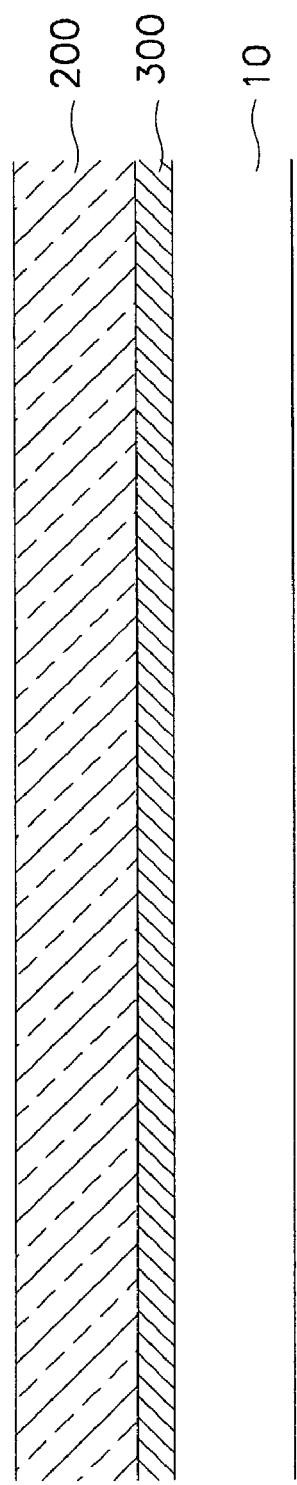

The first method, as shown in FIGS. 7A to 7C, is controlling the amount of incident light by forming a pattern such as a slit or a lattice that is smaller than the resolution of the exposure device, or by providing a partly-transparent layer on the mask.

At first, as shown in FIG. 7A, a photoresist layer 200 is coated on a thin film 300 on a substrate. At this time, it is preferable that the photoresist layer 200 is thicker than normal to control the thickness of the photoresist layer after development.

Next, as shown in FIG. 7B, light is illuminated on the photoresist layer 200 through a photomask 400 having a plurality of slits 410. At this time, the size of the slit 410 and the opaque portion 420 between the slits are smaller than the resolution of the exposure device. When a partly-transparent layer is used, a Cr layer of some thickness (not shown) is left on the mask 400, thereby reducing the amount of exposing light. Alternatively, a mask including films of different transmittances may be used.

When the photoresist layer 200 is exposed to light, the polymers of the photoresist layer 200 are disintegrated by the light. As the amount of the light increases, the polymers may even be completely disintegrated. The exposure step is finished when the polymers of a portion that is directly exposed to the light, for example, the left and right ends of the polymers in FIG. 7B, are completely disintegrated. However, the polymers of the photoresist layer 200 portion that are exposed through the slit pattern 410 are not completely disintegrated because the amount of incident light is less than that of the directly exposed portion. If the exposure time is too long, all the polymers of the photoresist layer 200 are disintegrated. Therefore, this should be avoided. In FIG. 7B, the reference numeral 210 indicates the removed part and the reference numeral 220 indicates the still remaining part.

Only the part 220 is left after developing the photoresist layers 210 and 220, and a thinner portion is left at the center that was exposed to light less than the fully exposed portion as shown in FIG. 7C.

The second method to make the thickness of the photoresist layer different is reflowing. This is described with reference to the examples shown in the FIGS. 8A to 8C and FIGS. 9A to 9C.

Figure 8A:
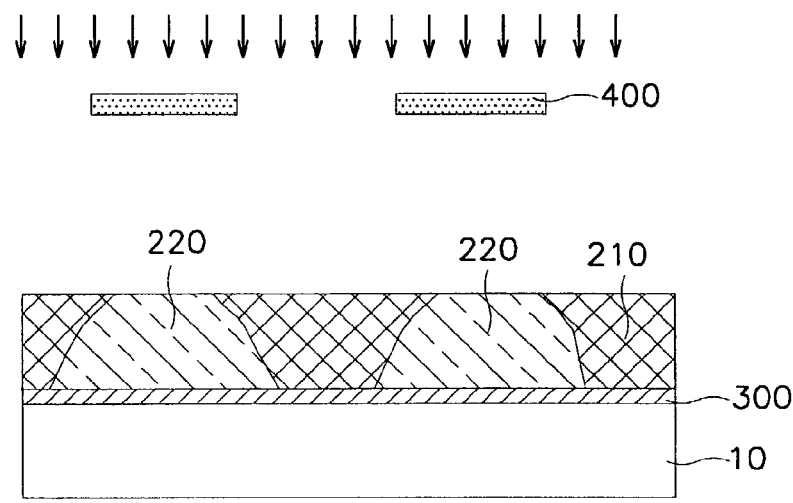
Figure 8B:
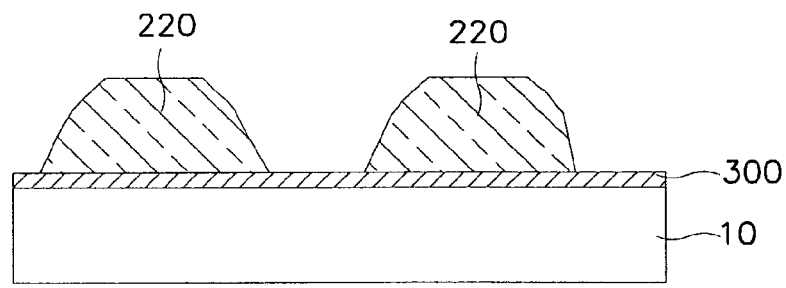
Figure 8C:
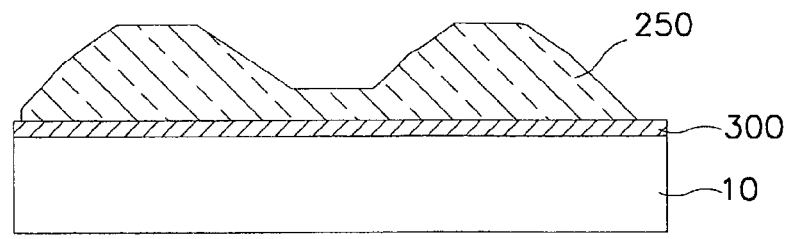

As shown in FIG. 8A, portions 210 and 220 of a photoresist layer are exposed to light through a mask 400 having respectively substantially transparent portions and substantially opaque portions. The portion 210 is a portion in which all polymers are disintegrated, and the other portion 220 is a portion in which all polymers remain. Then, as shown in FIG. 8B, the photoresist layer is developed to form a photoresist pattern having portions of zero and nonzero thicknesseses. However, as described above, the portion with zero thickness may have some residual thickness of photoresist. The photoresist pattern is subject to reflow such that the photoresist 220 flows into the zero thickness portions to form a new photoresist pattern 250.

Figure 9A:
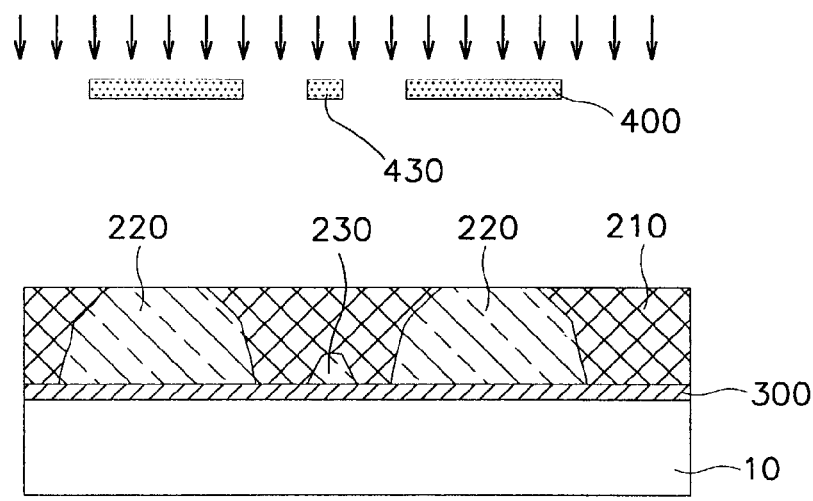
Figure 9B:
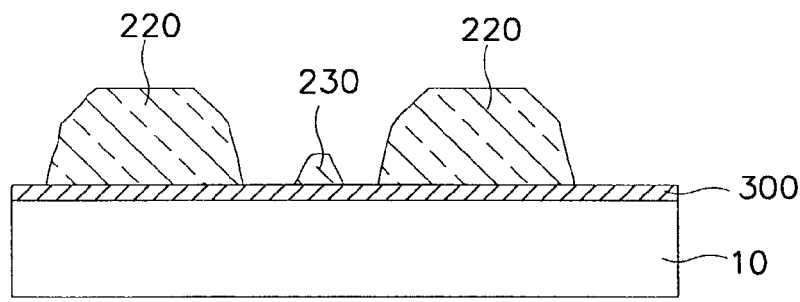
Figure 9C:
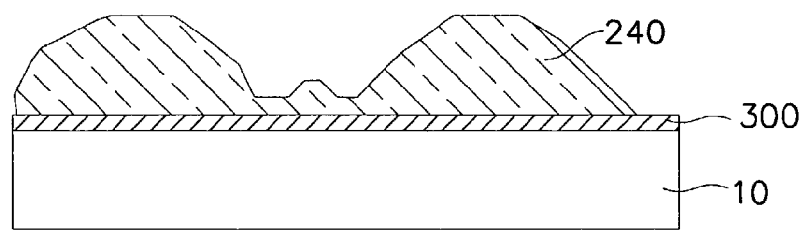

However, the zero thickness portions between the photoresist portions 220 may not be completely covered with photoresist by reflowing. To avoid such a case, an opaque pattern 430, which is smaller than the resolution of the exposure device, is provided on the mask 400 as shown in FIG. 9A. Then, as shown in FIG. 9B, a thinner portion 230 is formed between the thick portions 220 after development. By reflowing this photoresist pattern, a photoresist pattern 240 having a thick portion and a thin portion between the thick portions is formed.

Using these methods, a photoresist pattern having different thickness at different positions is obtained.

Referring back to FIG. 6C, the photoresist pattern 114 and the underlying layers including the conductor layer 60, the ohmic contact layer 50, the semiconductor layer 40, and the gate insulating layer 30 are subject to an etching process. After this step, a data wire and the underlying layers at the data wire part A and the semiconductor layer on the channel part C are left. Four layers of 60, 50, 40, and 30 in the remaining part B are removed from the substrate 10.

Figure 10A:
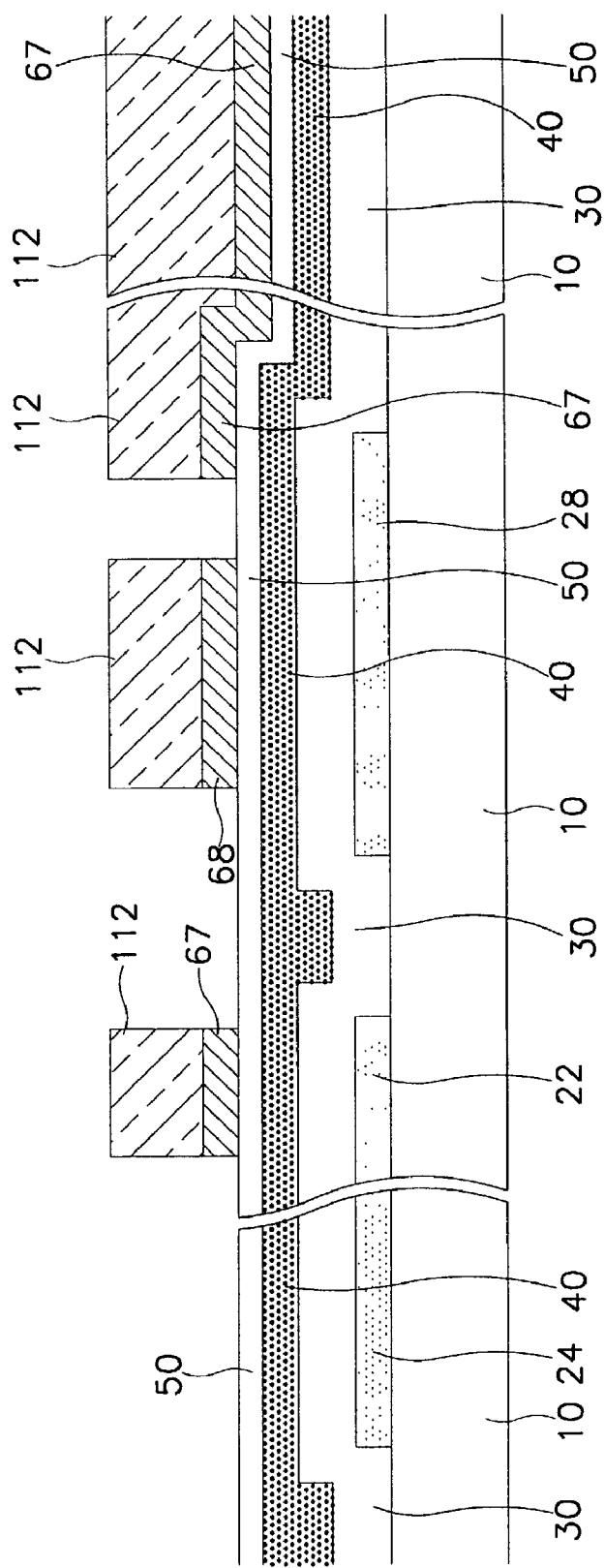
Figure 10B:
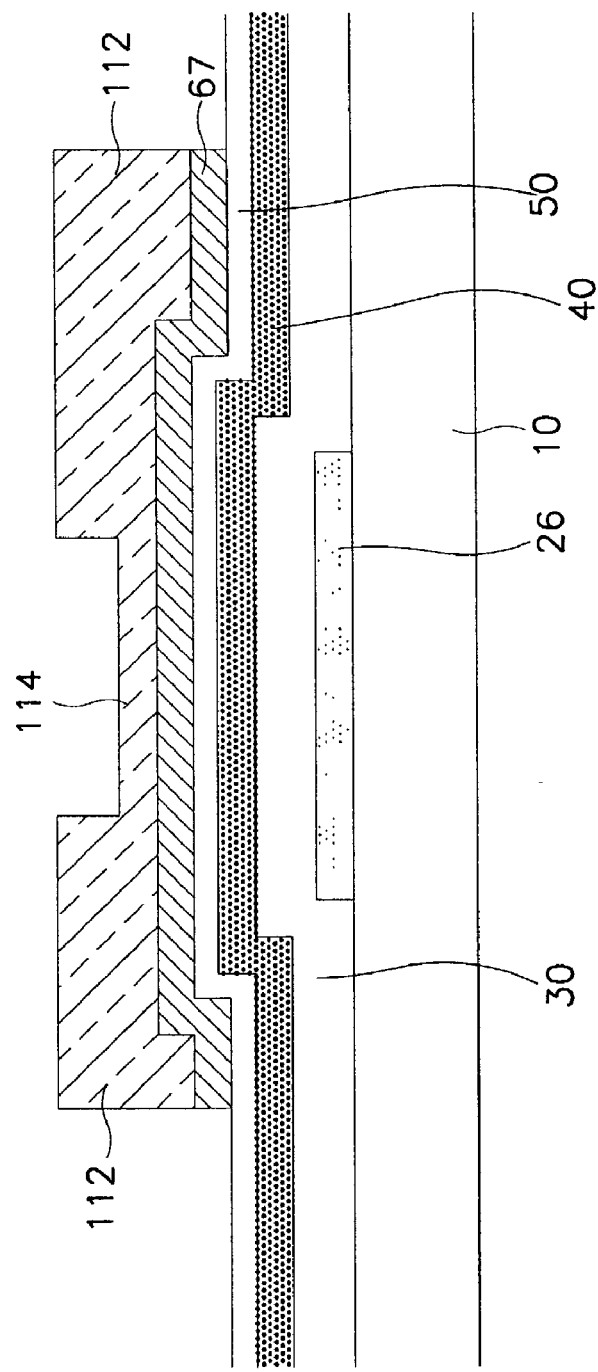
FIGS. 10B, 11B, and 12B are cross-sectional views at the next step following FIG. 6C taken along the line VIC–VIC' of FIG. 6A.

As shown in FIGS. 10A and 10B, the ohmic contact layer 50 of the part B is exposed by removing the conductor layer 60 thereon. At this time, both wet etch and dry etch can be used, and it is preferable that the conductor layer 60 is etched but the photoresist layers 112 and 114 are not etched. However, a dry etch method cannot meet such a condition. Therefore, when a dry etch method is employed, the first portion 114 needs to be made thicker than in the wet etch case so that the conductor layer 60 is not exposed.

If the conductor layer 60 is made of Mo or MoW alloy, Al or Al alloy, or Ta, either dry etch method or wet etch methods can be used. However, if the conductor layer 60 is made of Cr, a wet etch is better because Cr is not easily removed by dry etch. CeNHO$_3$ is available as a wet etchant for etching a Cr conductor layer 60. A gas mixture of CF$_4$ and HCl or CF$_4$ and O$_2$ is used for dry etching a Mo or MoW conductor layer 60. The etch rate of the mixture of CF$_4$ and O$_2$ system on the photoresist layer is similar to that of the conductor layer 60.

As shown in FIGS. 10A and 10B, only the portions of the conductor 60 under the photoresist layers 112 and 114 at the channel part C and the data wire part B for source/drain electrodes and a storage capacitor are left. The remaining portion of the conductor layer 60 at part B is totally removed to expose the underlying ohmic contact layer 50. At this time, the conductor patterns 67 and 68 have the same layout as the data wire parts 62, 64, 65, 66, and 68 except that the source electrode 65 and the drain electrode 66 are connected. When a dry etch is used, the photoresist layers 112 and 114 are also etched to a certain thickness.

Figure 11B:
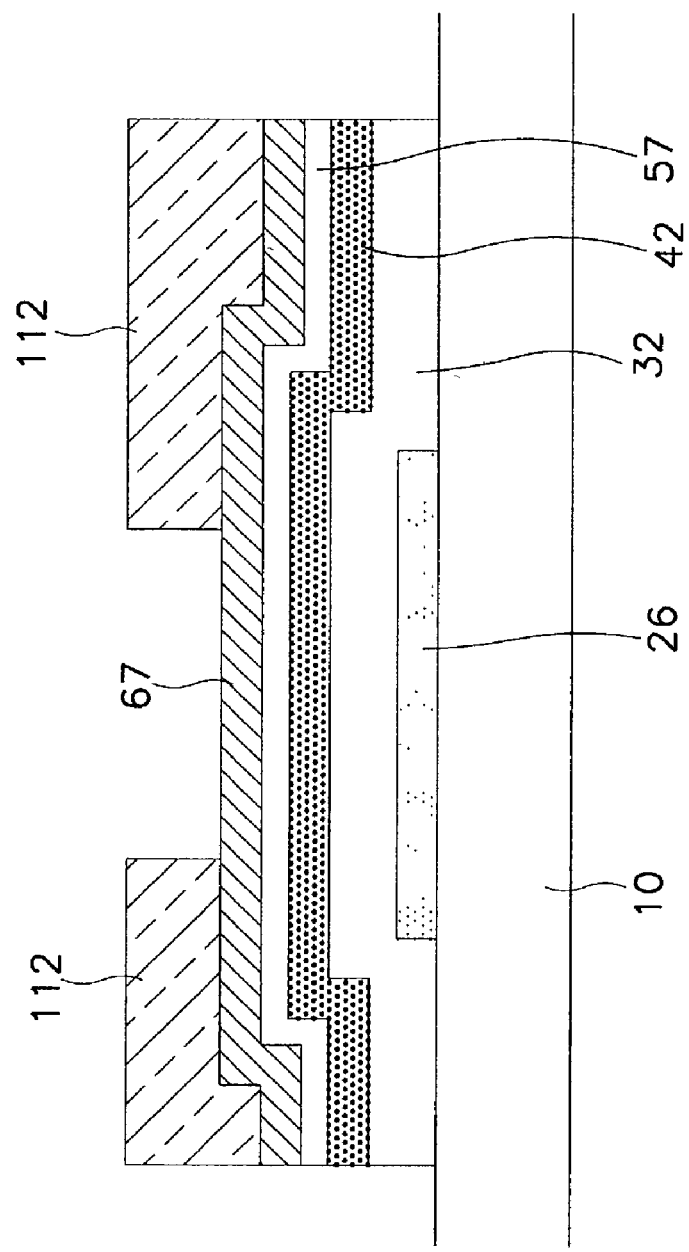

Next, the exposed portions of the ohmic conductor layer 50 at part B, the semiconductor layer 40, and the gate insulating layer 30 thereunder of FIGS. 10A and 10B are removed by dry etching along with first portion 114 of the photoresist layer, as shown in FIGS. 11A and 11B. The photoresist patterns 112 and 114, the ohmic contact layer 50, the semiconductor layer 40, and the gate insulating layer 30 are all etched (the semiconductor layer and the ohmic contact layer have almost the same etch rate), but the gate wire parts 22, 24, 26, and 28 must not be etched. If the etch rates of the photoresist patterns 112 and 114, the semiconductor layer 40, and the gate insulating layer 30 are almost the same, the thickness of the first portion 114 is equal to or less than that of the sum of the semiconductor layer 40, and the gate insulating layer 30. The portion of the gate insulating layer 30 covering the substrate 30 and the gate wire parts 22, 24, 26, and 28 may remain after etching.

Then, as shown in FIGS. 11A and 11B, the conductor pattern 67 is exposed by removing the first portion 114 of the channel part C, and the substrate 10 and the gate wire part 22, 24, 26, and 28 are exposed by removing the ohmic contact layer 50, the semiconductor layer 40, and the gate insulating layer 30 of the part B shown in FIG. 11B. At the same time, the thickness of the second portion 112 over the data wire part A is reduced by etching. Furthermore, the semiconductor patterns 42 and 48, and the gate insulating layers 32 and 38 are completed at this step. The reference numerals 57 and 58 respectively represent the ohmic contact layer pattern under the conductor patterns 67 and 68 for the source/drain electrode and the storage capacitor.

The remaining photoresist layer on the conductor pattern 67 is then removed by ashing or plasma etching.

Figure 12A:
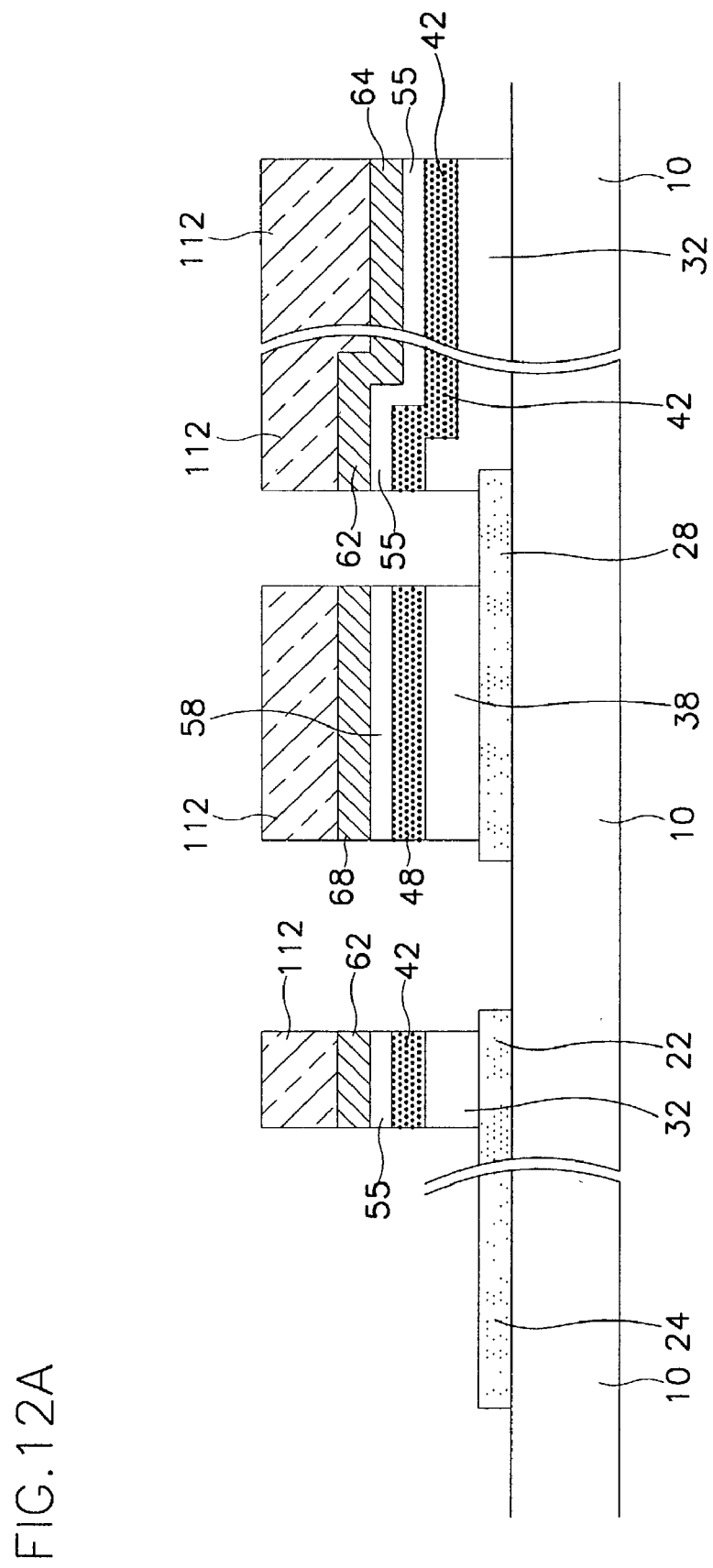
Figure 12B:
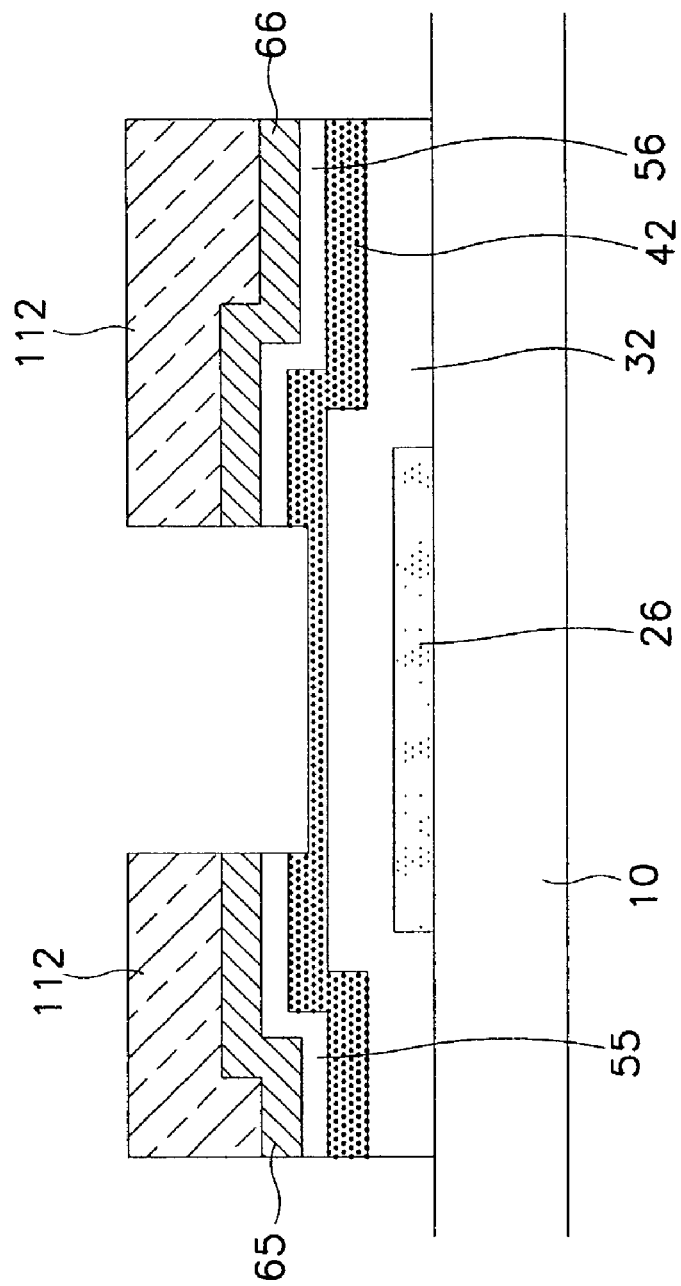

Next, as shown in 12A and 12B, the conductor pattern 67 for source/drain electrodes at the channel part C and the ohmic contact layer pattern 57 for source/drain electrodes of FIG. 11B are removed by etching. At this time, it is possible either to etch both the conductor pattern 67 and the ohmic contact layer 57 by a dry etching method, or to etch the conductor pattern 67 by a wet etching method and the ohmic contact layer 57 by a dry etching method. In the former case, it is preferable that the etching methods showing a large etch selectivity between the conductor pattern 67 and the ohmic contact layer pattern 57 are employed. If the etch selectivity is not large enough, it is hard to detect the etch stop point and to control the thickness of the semiconductor pattern 42 around the channel part C. A gas mixture of SF$_6$ and O$_2$, for example, meets such conditions. In the latter case of doing the wet etch and the dry etch sequentially, the lateral sides of the conductor pattern 67 subject to wet etch are also etched, while those of the ohmic contact layer pattern 57, which is dry etched, are hardly etched at all. Thereby, the profile of these two patterns 67 and 57 makes a step like form. The gas mixture of CF$_4$ and O$_2$ is an example of an etch gas system for etching the ohmic contact layer pattern 57 and the semiconductor pattern 42. The semiconductor pattern 42 may also be formed to have a uniform thickness by etching with the gas mixture of CF$_4$ and O$_2$. At this time, as shown in FIG. 12B, the thickness of the semiconductor pattern 42 may be reduced and the second portion 112 of the photoresist pattern is also etched to a certain thickness. The etch conditions may also be set not to etch the gate insulating layer 30, and it is preferable to make the photoresist pattern thick enough not to expose the data wire parts 62, 64, 65, 66, and 68.

As a result, the source electrode 65 and the drain electrode 66 are separated, and the data wire parts 62, 64, 65, 66, and 68 and the underlying contact layer patterns 55, 56, and 58 are completed.

Next, the remaining second portion 112 of the photoresist layer on the data wire (Region A of FIG. 6C) is removed. However, the second portion 112 may be removed after removing the conductor pattern 67 for source/drain electrodes on the channel part C of FIG. 11B and before removing of the ohmic contact layer pattern 57 under the conductor pattern 67.

To summarize, this process can be done by using both wet etching and dry etching in turn, or by using only dry etching.

In the former case, the conductor layer of the part B is first removed by wet etching, and then the underlying ohmic contact layer and the semiconductor layer are removed by dry etching. At this time, the photoresist layer of the part C is consumed to a certain thickness, and the part C may have or may not have any residual photoresist left, which substantially depends on the initial thickness of the photoresist layer of the part C. When the part C has residual photoresist left, this residual photoresist is removed by ashing. Finally, the conductor layer of the part C is wet etched to separate the source and the drain electrodes, and the ohmic contact layer of the part C is removed by using dry etching.

In the latter case, the conductor layer, the ohmic contact layer, and the semiconductor layer of the part B are removed by dry etching. As in the former case, the part C may have or may not have residual photoresist left, and residual photoresist is removed by ashing when part C does have any residual photoresist. Finally, the conductor layer of the part C is dry etched to separate the source and the drain electrodes, and the ohmic contact layer of the part C is removed by dry etching.

Also, if the data wire is etched, the semiconductor pattern, the contact layer pattern, and the data wire may be completed in the same step at once. That is to say, it is desirable that the photoresist pattern 114 and the underlying contact layer 50 of the part C are dry etched, and the portion of the photoresist pattern 112 of the part A is dry etched during the dry etching of the conductor layer, the ohmic contact layer, and the semiconductor layer of the part B.

Since the latter process uses only one type of etching method, it is simpler, although it is harder to achieve proper etching conditions. On the other hand, the former process can easily meet the proper etching condition, although more complicated.

Figure 13A:
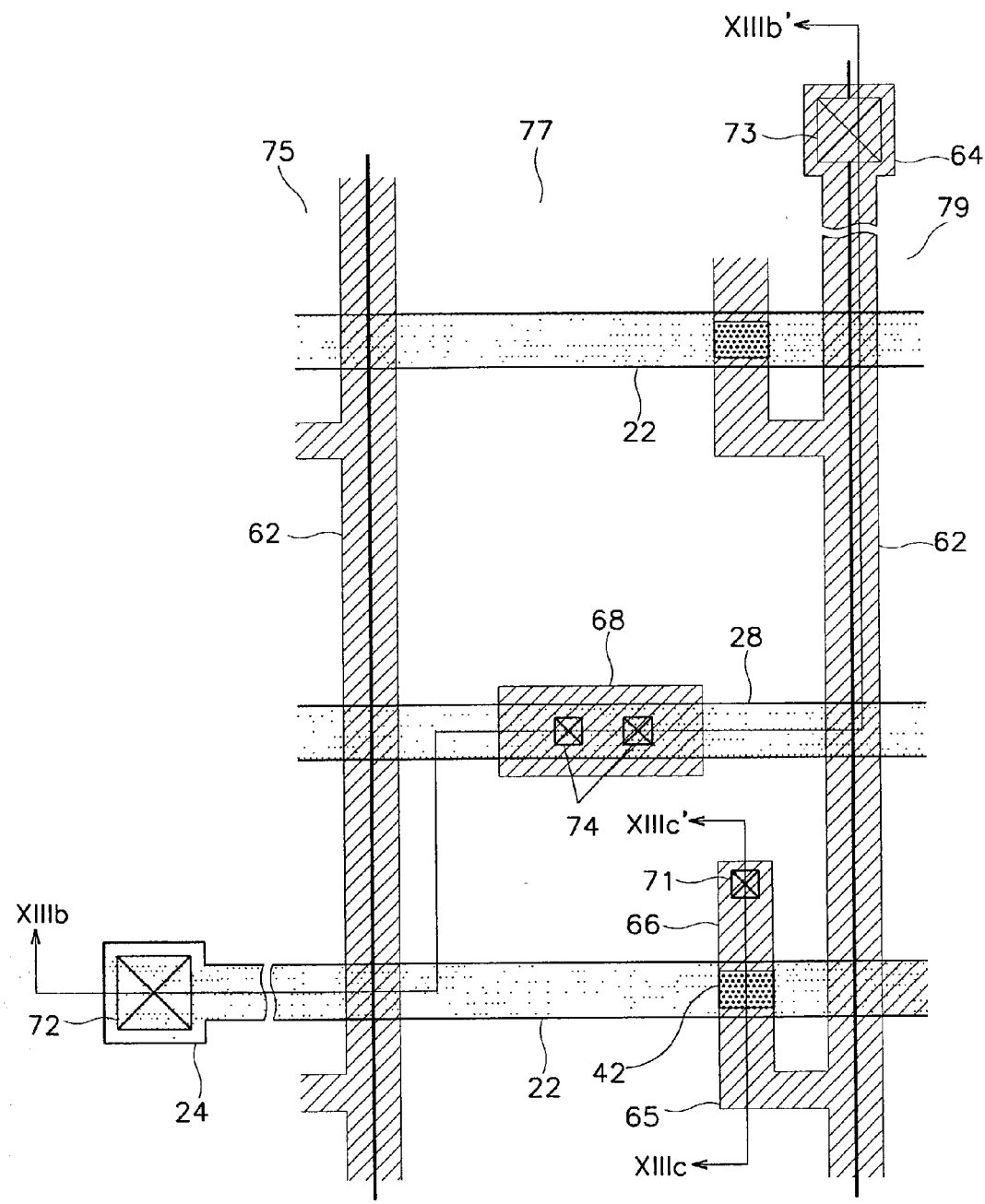
FIG. 13A is a layout view of thin film transistor array panel at the next step following in FIGS. 12A and 12B.
Figure 13B:
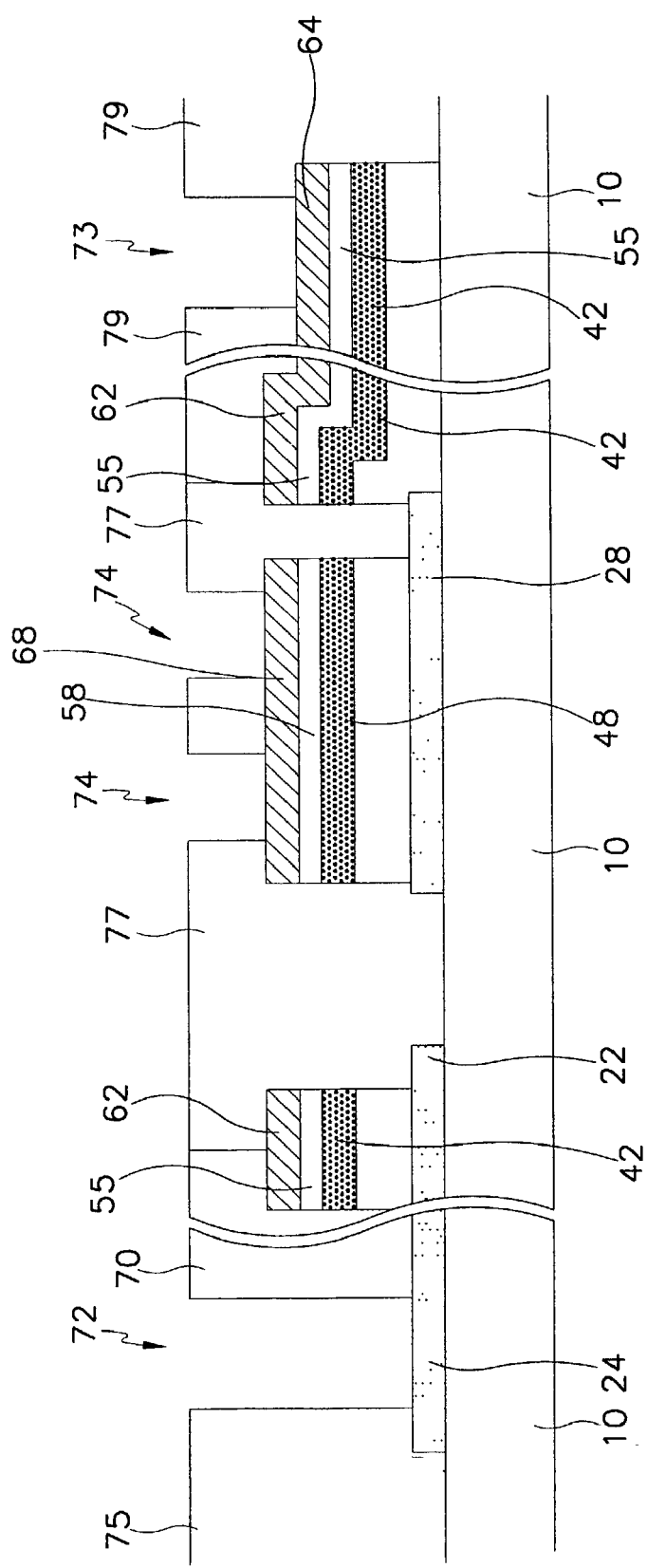
FIGS. 13B and 13C are the cross-sectional views taken along the lines XIIIB–XIIIB' and XIIIC–XIIIC' of FIG. 13A, respectively.
Figure 13C:
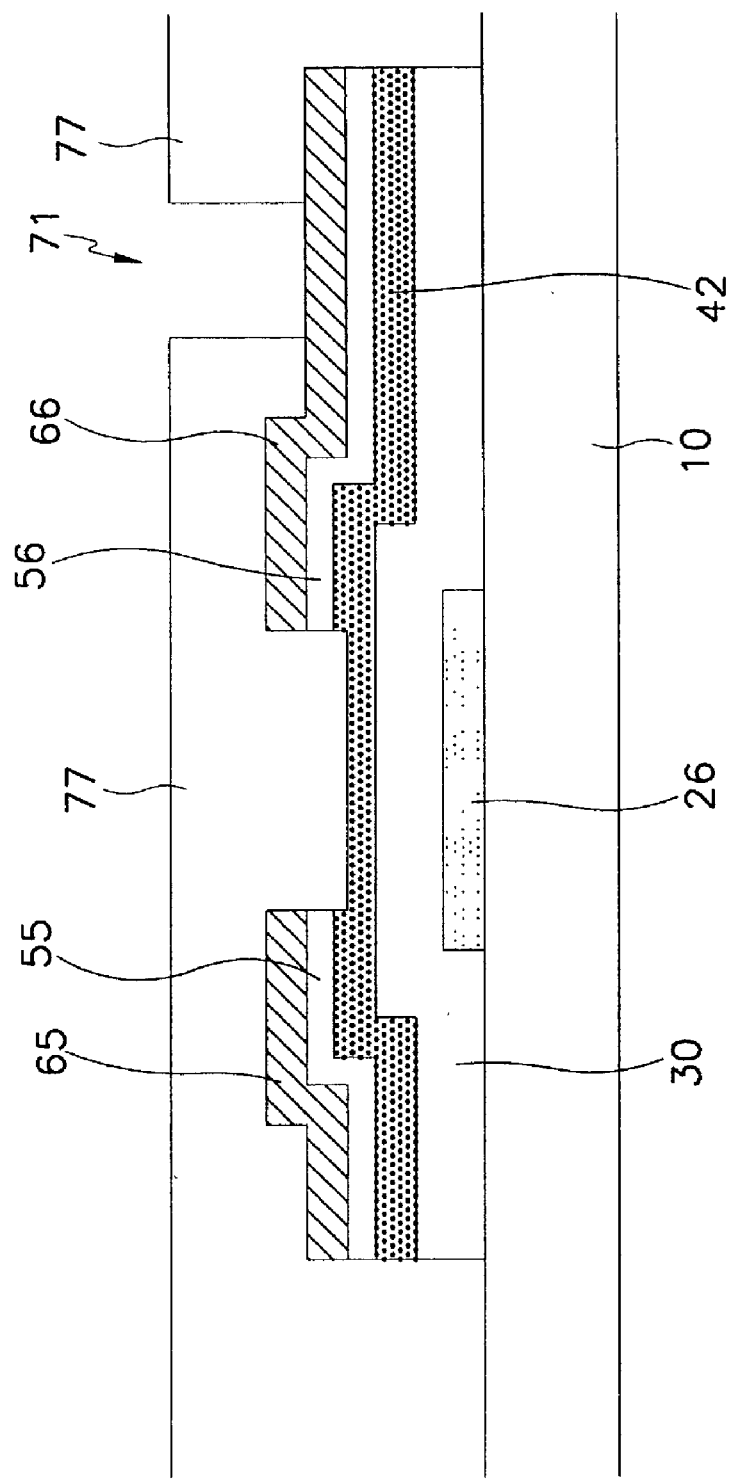

After forming data wire parts 62, 64, 65, 66, and 68, photoresist layers including red, green, and blue resins are coated on the substrate and patterned to form color filters 75, 77, and 79 through photolithography processes using a third mask, a fourth mask and a fifth mask as shown in FIGS. 13A to 13C. At this time, contact holes 71, 72, 73, and 74 respectively exposing the drain electrode 66, the gate pad 24, the data pad 64, and the conductor pattern 68 for the storage capacitor are formed. Here, it is preferable that the color filters 75, 77, and 79 completely cover the data line 62. In this embodiment, the color filters 75, 77, and 79 do not overlap each other. However, it is preferable that the color filters 75, 77, and 79 overlap each other to prevent gate wire defects and data wire defects in the later manufacturing process. The overlap of the gate line 22 and the data line 62, and the intersections of the color filters 75, 77, and 79 and the gate line 22 and the data line 62 may form a very steep step. However, these deep steps may be moderated by using a mask having partially different transmittances when forming the color filters 75, 77, and 79. A planarization step may be added to flatten these steps.

Next, as shown in FIGS. 1 to 3, an ITO layer is deposited to a thickness of 400 Å to 500 Å, and etched by using a sixth mask to form a pixel electrode 82, a redundant gate pad 84, and a redundant data pad 86.

In this embodiment, by forming the data wire parts 62, 64, 65, 66, and 68, the ohmic contact layer pattern 55, 56, and 58, and the semiconductor patterns 42 and 48 through one photolithography process, and the red, green, and blue color filters 75, 77, and 79 as a passivation layer, an LCD panel having thin film transistor and color filters together may be completed in just six photolithography processes In this embodiment, the red, green, and blue color filters 75, 77, and 79 are used as a passivation layer, but another passivation layer may be added. In this method, the passivation layer must be etched to form contact holes 71, 72, 73, and 74 respectively exposing the drain electrode 66, the gate pad 24, the data pad 64, and the conductor pattern 68 for the storage capacitor. In this case, the gate insulating layer 30 may not be etched when etching the conductor layer 60 and the underlying layers using the photoresist patterns 112 and 114 as an etch mask in the second photolithography step. Instead, the gate insulating layer 30 is etched along with the passivation layer to form contact holes 71, 72, 73, and 74. This method will be described below.

First, the structure of the thin film transistor panel for a liquid crystal display of the second embodiment according to the present invention will be described with reference to FIGS. 14 and 16.

Figure 14:
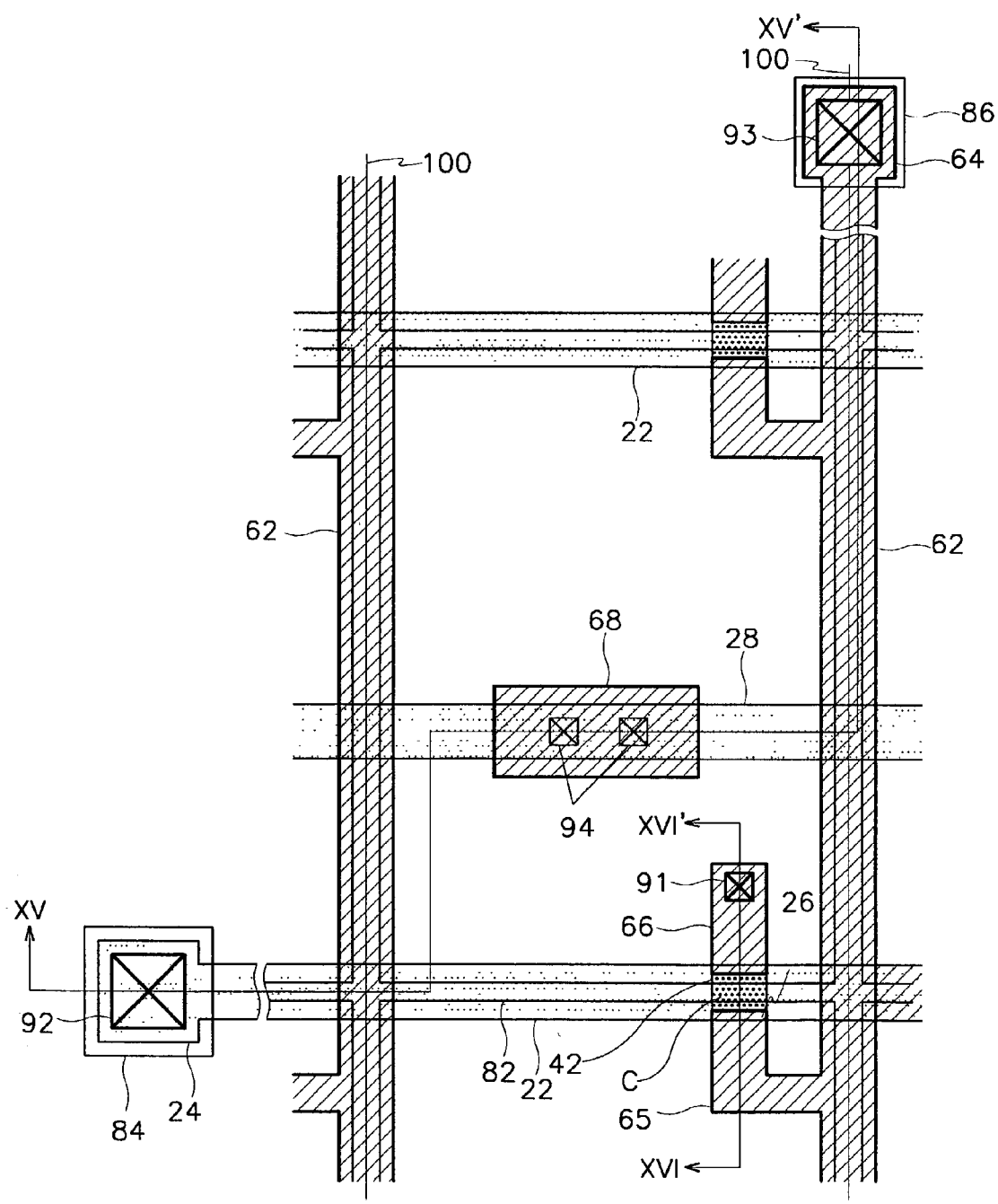
FIG. 14 is a layout view of a thin film transistor array panel for a liquid crystal display according to the second embodiment of the present invention.
Figure 15:
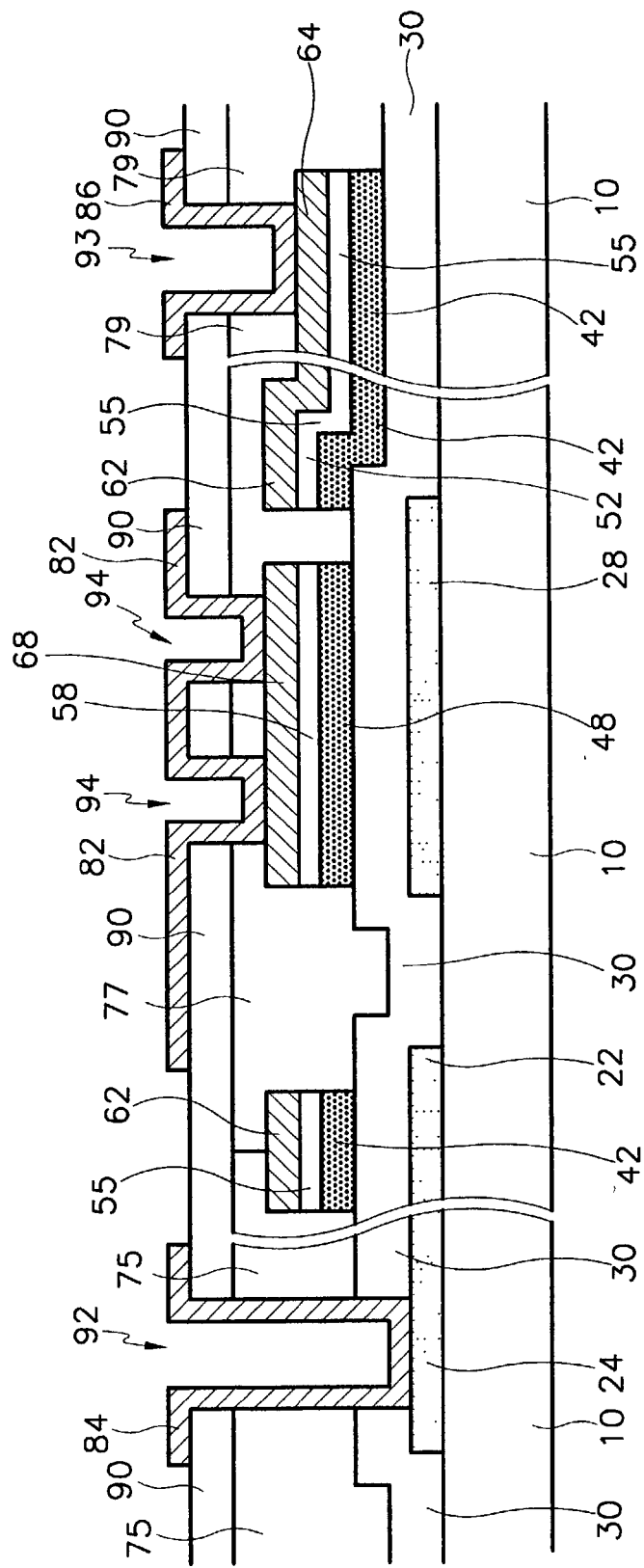
FIGS. 15 and 16 are cross-sectional views taken along lines XV–XV' and XVI–XVI' of FIG. 14, respectively.
Figure 16:
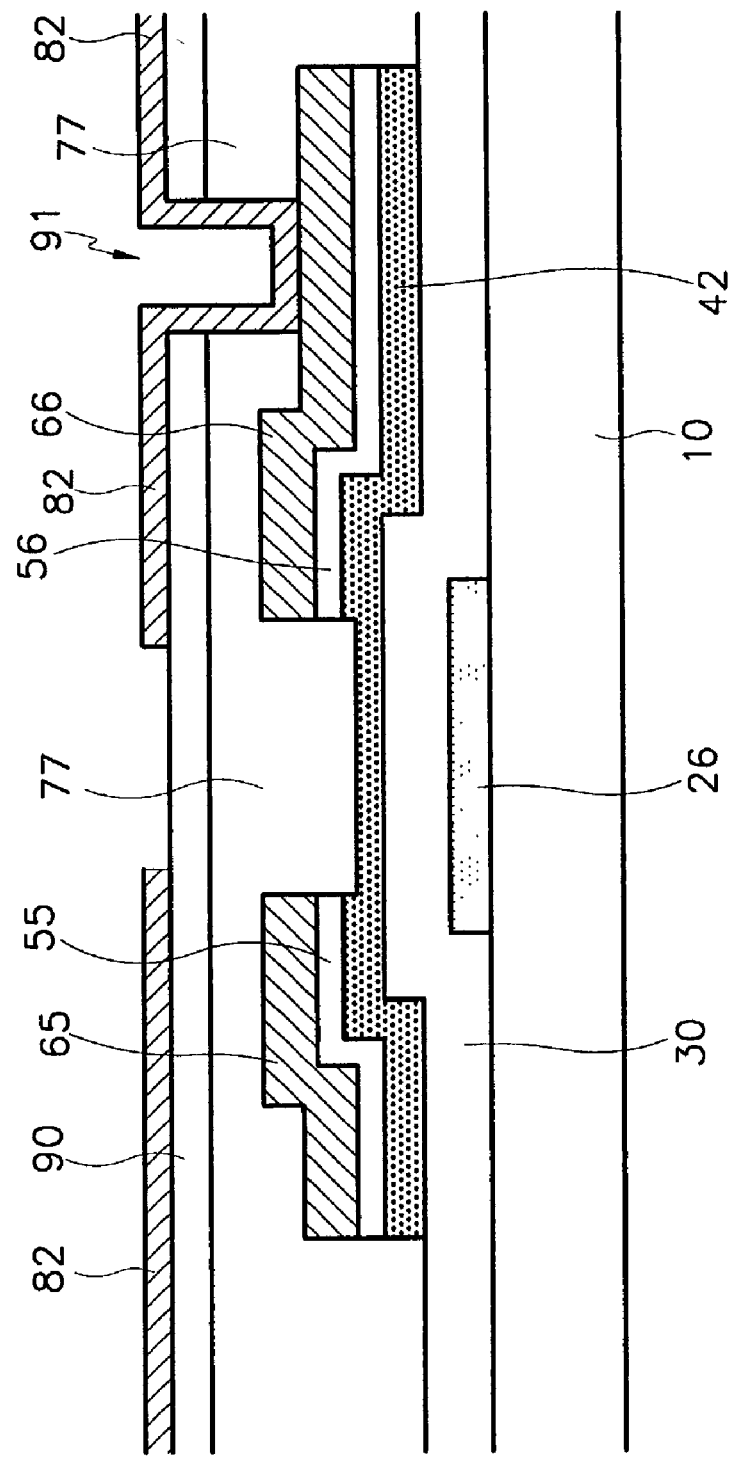

FIG. 14 is a layout view of a thin film transistor array panel for a liquid crystal display according to the second embodiment of the present invention, and FIGS. 15 and 16 are cross-sectional views taken along lines XV–XV' and XVI–XVI' of FIG. 14, respectively.

Most of the structure is similar to the first embodiment.

Gate wires 22, 24, and 26, and a storage electrode 28 are made of a conductive material having some degrees of photosensitivity.

A gate insulating layer 30 of silicon-nitride (SiNx) covering the gate wire parts 22, 24, and 26, and the storage electrode 28 is formed on the whole surface of an insulating substrate 10.

Also, data wires 62, 64, 65, and 66, and a conductor pattern 68 for a storage capacitor, which are formed on an ohmic contact layer patterns 55, 56, and 58, are made of a conductive material having some degrees of photosensitivity.

Here, the data wires 62, 64, 65, and 66, the conductor pattern 68, the gate wires 22, 24, and 26, and the storage electrode 28 are made of a photosensitive conductive material. However, like the first embodiment, they may be made of metal or conductive material such as aluminum (Al) or aluminum alloy, molybdenum (Mo) or molybdenum-tungsten (MoW), chromium (Cr), and tantalum (Ta) and may have a multiple-layered structure. Of course, in a multiple-layered structure, it is preferable that one layer is made of a material having a low resistivity and another layer is made of a material having good contacting properties.

Red, blue, and green color filters 75, 77, and 79 are made of photosensitive material and are formed on the data wire parts 62, 64, 65, 66, and 68, and the gate insulating layer 30 that is not covered by the data wire parts 62, 64, 65, 66, and 68. The color filters 75, 77, 79 that have contact holes 71, 72, 73, and 74 are covered by a passivation layer 90, which is made of organic insulating material and is planarized.

The red, blue, and green color filters 75, 77, and 79, and the passivation layer 90 have contact holes 91, 93, and 94 respectively exposing the drain electrode 66, the data pad 64 and the conductor pattern 68 for storage capacitor, and contact hole 92 exposing the gate pad 24.

Pixel electrodes 82, which receive an image signal and generate an electric field with a common electrode of an upper panel, are formed on the passivation layer 90. The pixel electrode 82 is made of a transparent conductive material such as indium tin oxide (ITO). The pixel electrode 82 is connected to the drain electrode 66 both physically and electrically through the contact hole 71, and receives image signals from the drain electrode. Even though the aperture ratio increases by overlapping the pixel electrode 82 on the gate lines 22 or the adjacent the data lines, these lines are not required to be overlapped by the pixel electrode. The pixel electrode 82 is connected to the conductor pattern 68 for the storage capacitance through the contact hole 74 and transmits the image signals to the conductor pattern 68.

A redundant gate pad 84 and a redundant data pad 86 respectively connected to the gate pad 24 and the data pad 64 through the contact holes 72 and 73 are formed on the gate pad 24 and the data pad 64. These redundant pads 84 and 86 are optional as they protect the pads 24 and 64 from corrosion by the ambient air and strengthens the adhesion between the external circuit and the pads 24 and 64.

A method for manufacturing a thin film transistor array panel according to a second embodiment of the present invention will now be described with reference to the FIGS. 17A to 20C and FIGS. 14 to 16.

Figure 17A:
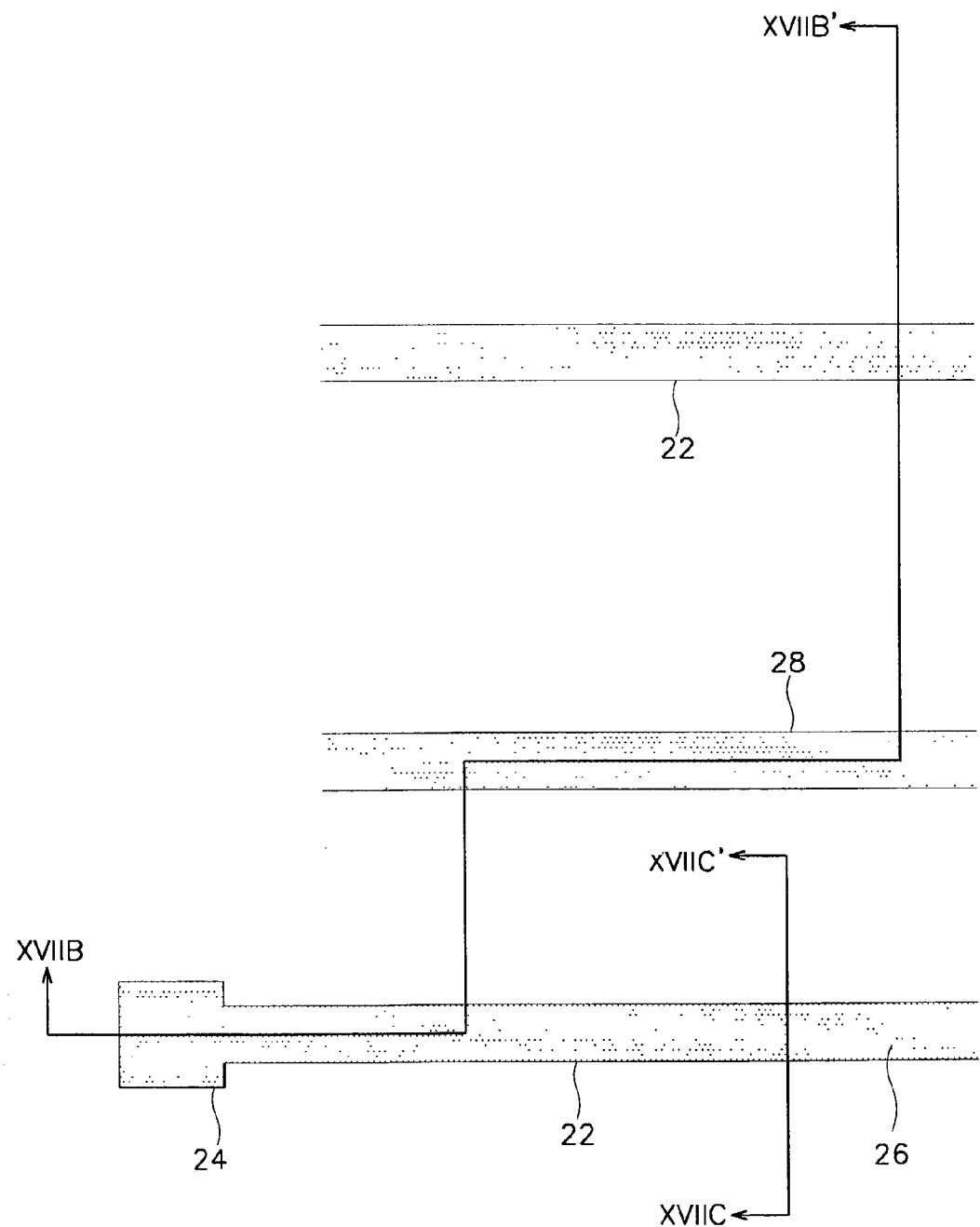
FIG. 17A is a layout view of the thin film transistor array panel according to the second embodiment of the present invention showing a first manufacturing step.
Figure 17B:
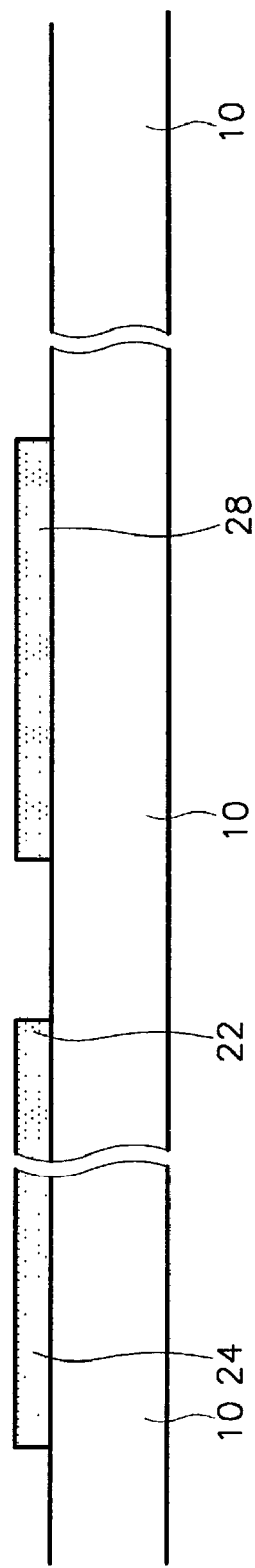

At first, as shown in FIGS. 17A and 17B, a photosensitive conductive layer is laid on a substrate 10 to a thickness of 2,000 Å to 10,000 Å, and gate wire parts including a gate line 22 having a gate electrode 26, a gate pad 24, and a storage electrode 28 are formed only by exposure and development through a photolithography process using a mask. When forming the gate wires here, the gate wires may be formed through a photolithography process using a photoresist pattern. However, if a photosensitive conductive layer is used, like in this second embodiment, an etch step using the photoresist pattern as an etch mask may be omitted, and the gate wires 22, 24, 26, and 28 may be formed by a photolithography process that includes only exposure and development steps. Accordingly, the manufacturing process can be simplified.

An example of a photosensitive conductive layer is an Ag paste photoresist mixture, and photosensitive Ag paste may be coated on the substrate 10 through screen printing.

The photosensitive conductive layer may be an organic metal layer formed through metal organic chemical vapor deposition. In copper organic metal, for example, copper atoms are intertwined with organic molecules. A photosensitive conductive layer may be formed by mixing photoresist materials with such a copper organic metal, and depositing the mixture onto the substrate.

Figure 18A:
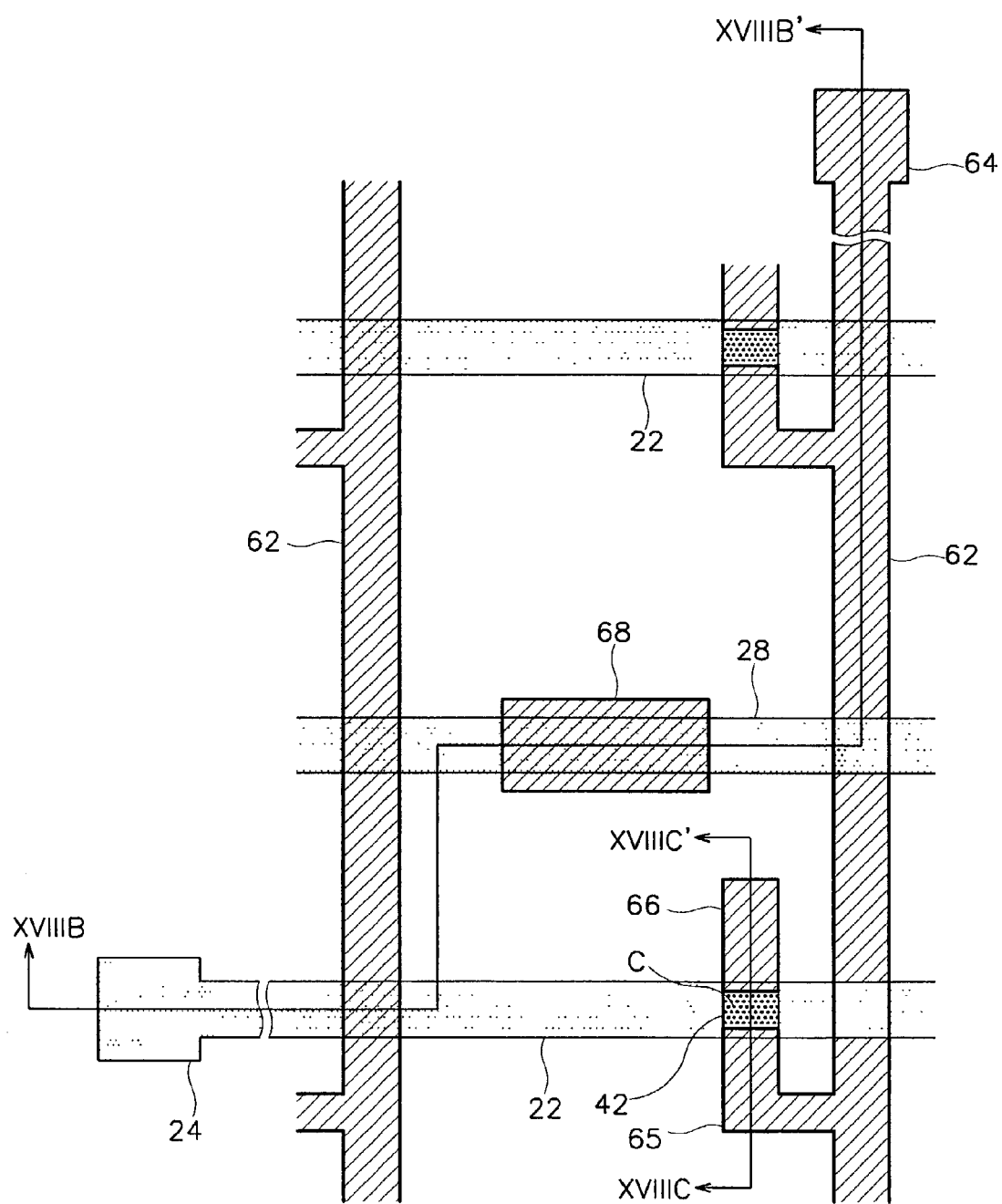
FIG. 18A is a layout view of the thin film transistor array panel in the next step following FIG. 17A.
Figure 18B:
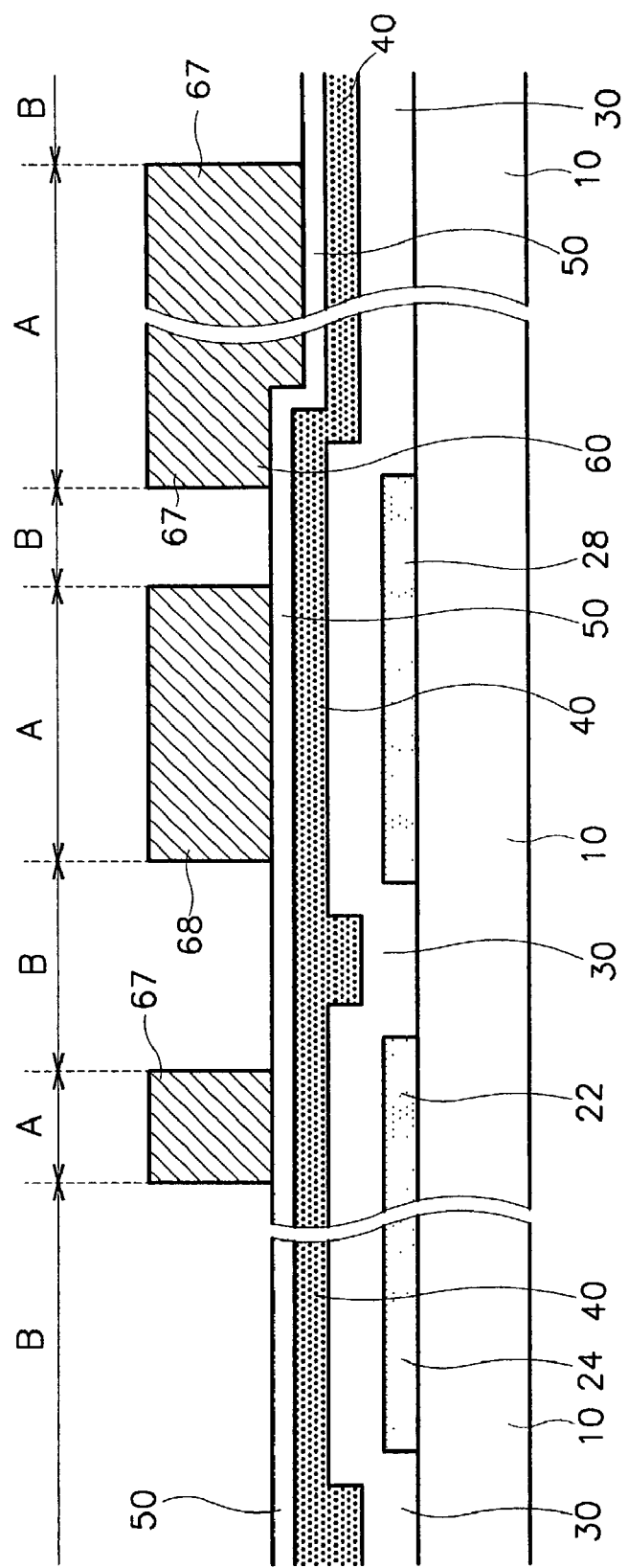
FIGS. 18B and 18C are respectively cross-sectional views taken along the lines XVIIIB–XVIIIB' and XVIIIC–XVIIIC' of FIG. 18A.
Figure 18C:
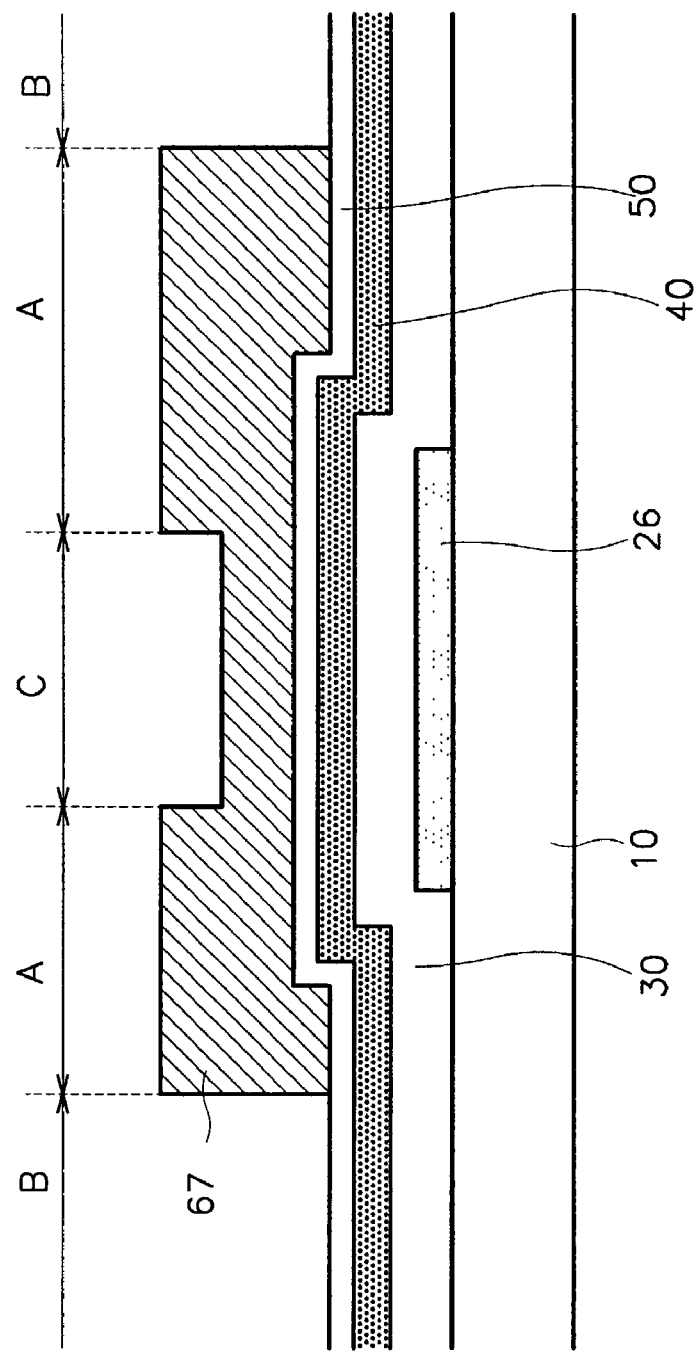

Next, as shown in FIGS. 18A and 18C, a gate insulating layer 30, a semiconductor layer 40, and an ohmic contact layer 50 are sequentially deposited to thicknesses of 1,500 Å to 5,000 Å, 500 Å to 2,000 Å, and 300 Å to 600 Å, respectively, by such methods as chemical vapor deposition (CVD). Then, a data conductor layer, such as a photosensitive conductive material is formed to a thickness of 10,000 Å to 20,000 Å, and is exposed to light through a second mask and developed to form a data wire pattern 67 and 68. At this time, the first portion of the data wire pattern located between a source electrode 65 and a drain electrode 66, i.e., a thin film transistor channel part C as shown in FIG. 18C, is thinner than the second portion of the data wire pattern located over the data wire portion A where a data wire parts 62, 64, 65, 66, and 68 will be formed. The third portion, the remaining portion located at portion B, is where a data conductor layer is completely removed, as with the photoresist patterns 112 and 114 of the first embodiment. The method forming the data wire patterns 67 and 68 having different thicknesses depending on positions is the same as that of the first embodiment.

Figure 19A:
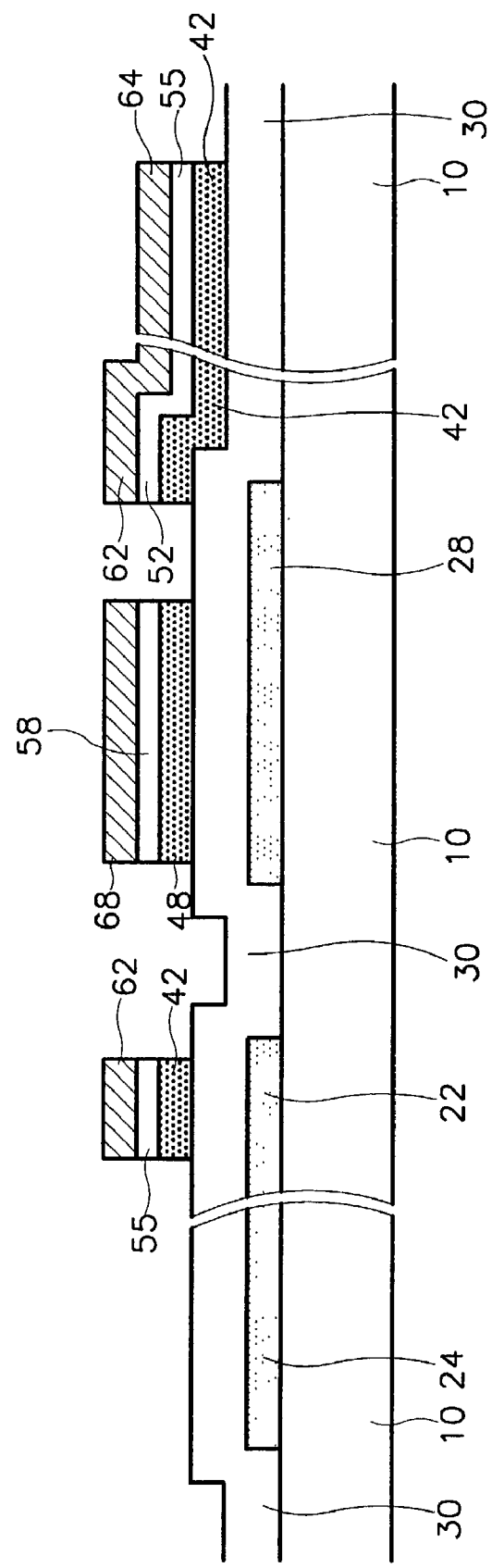
FIGS. 19A and 19B are cross-sectional views at the next step following FIGS. 18B and 18C taken along the lines XVIIIB–XVIIIB' and XVIIIC–XVIIIC' of FIG. 18A.
Figure 19B:
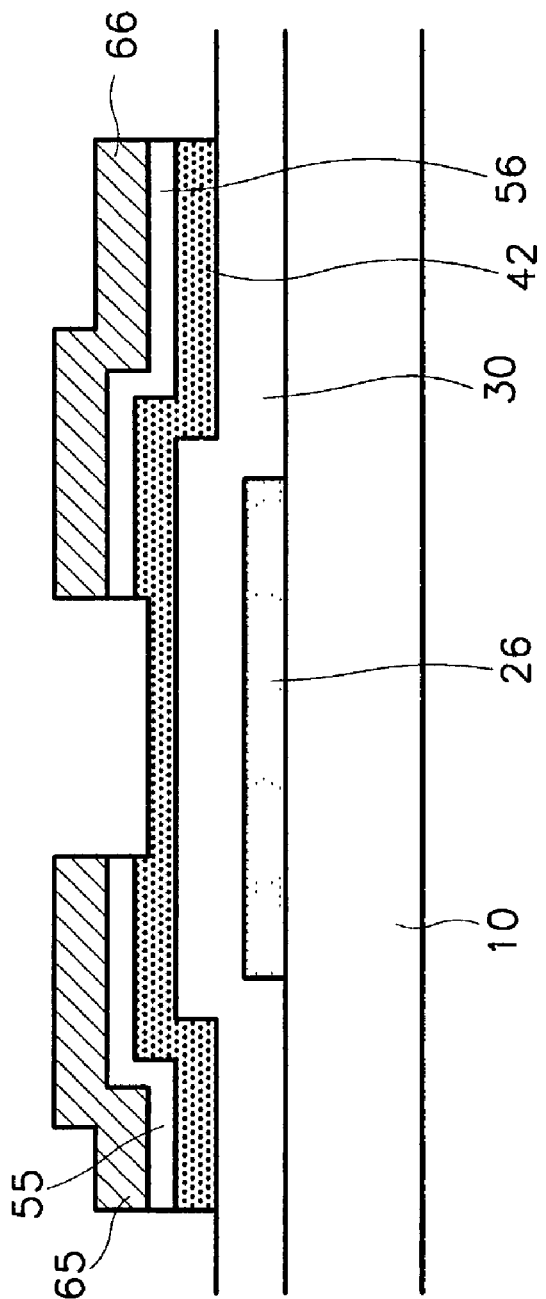

Next, as shown in FIGS. 19A and 19B, the data wire patterns 67 and 68, and the underlying layers including the ohmic contact layer 50 and the semiconductor layer 40 are then subject to an etching process. Finishing this step, the data wire pattern and the underlying layers at the data wire part A, as well as only the semiconductor layer on the channel part C remain. In addition, the layers 50 and 40 in the remaining part B are removed from the gate insulating layer 30.

As shown in FIGS. 19A and 19B, the gate insulating layer 30 is exposed by removing the ohmic contact layer 50 and the semiconductor layer 40 of the part B, and semiconductor patterns 42 and 48 are completed. At this time, the data wire pattern 67 of the channel portion C is etched and is removed. Next, the data wire pattern 67 of the channel portion C is completely removed by dry-etch. The underlying ohmic contact layer 50 is removed to complete the data wire including the data line 62, the data pad 64, the source electrode 65, the drain electrode 66, and the conductor pattern 68 for storage capacitor, and the underlying ohmic contact layer patterns 55, 56, and 58. At this time, the data wire 62, 64, 65, and 66, and the conductor pattern for a storage capacitor is also etched to a certain thickness. Here, it is preferable that the etch condition is controlled not to etch the gate insulating layer 30.

Figure 20A:
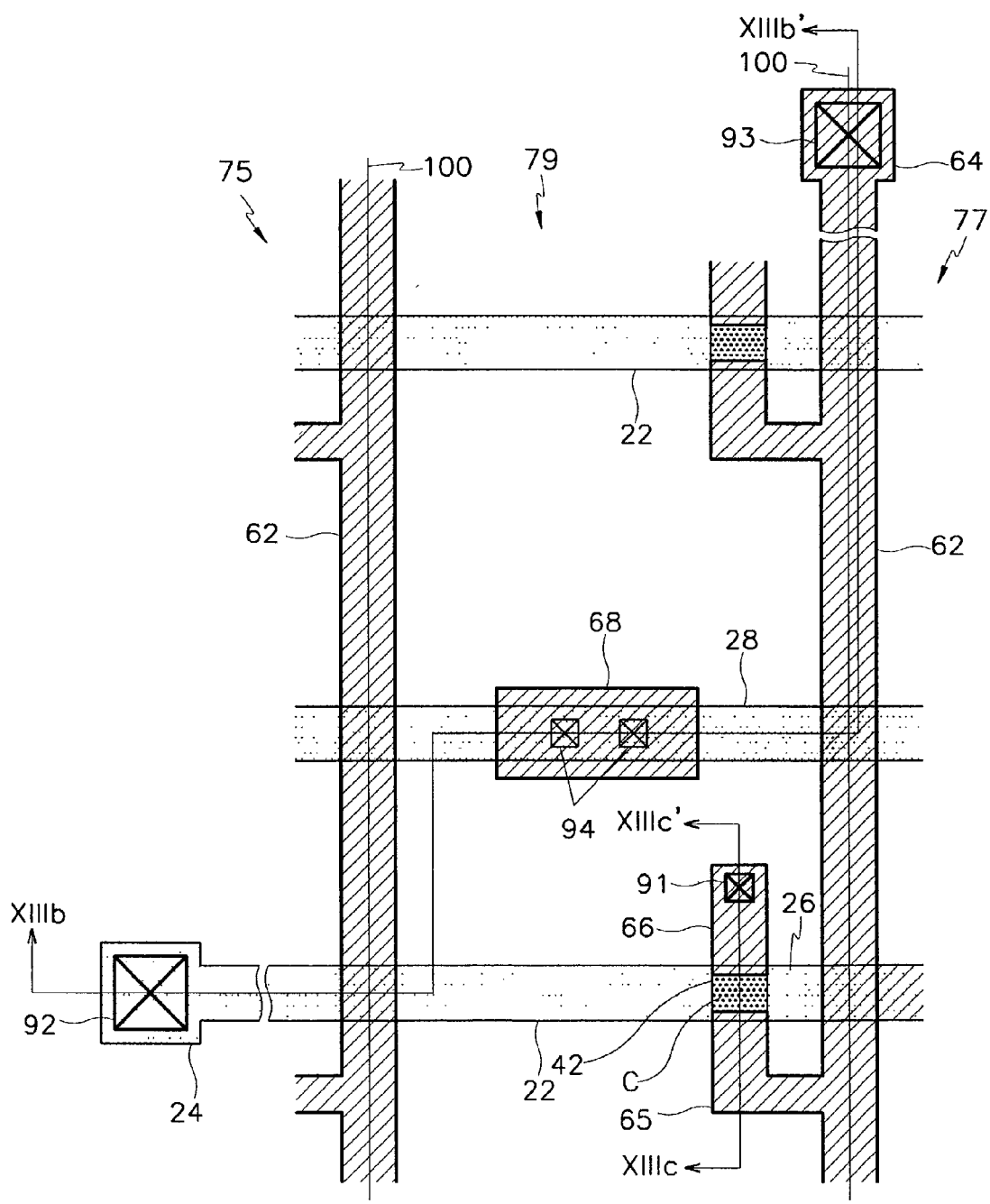
FIG. 20A is a layout view of thin film transistor array panel in the next step following in FIGS. 19A and 19B.
Figure 20B:
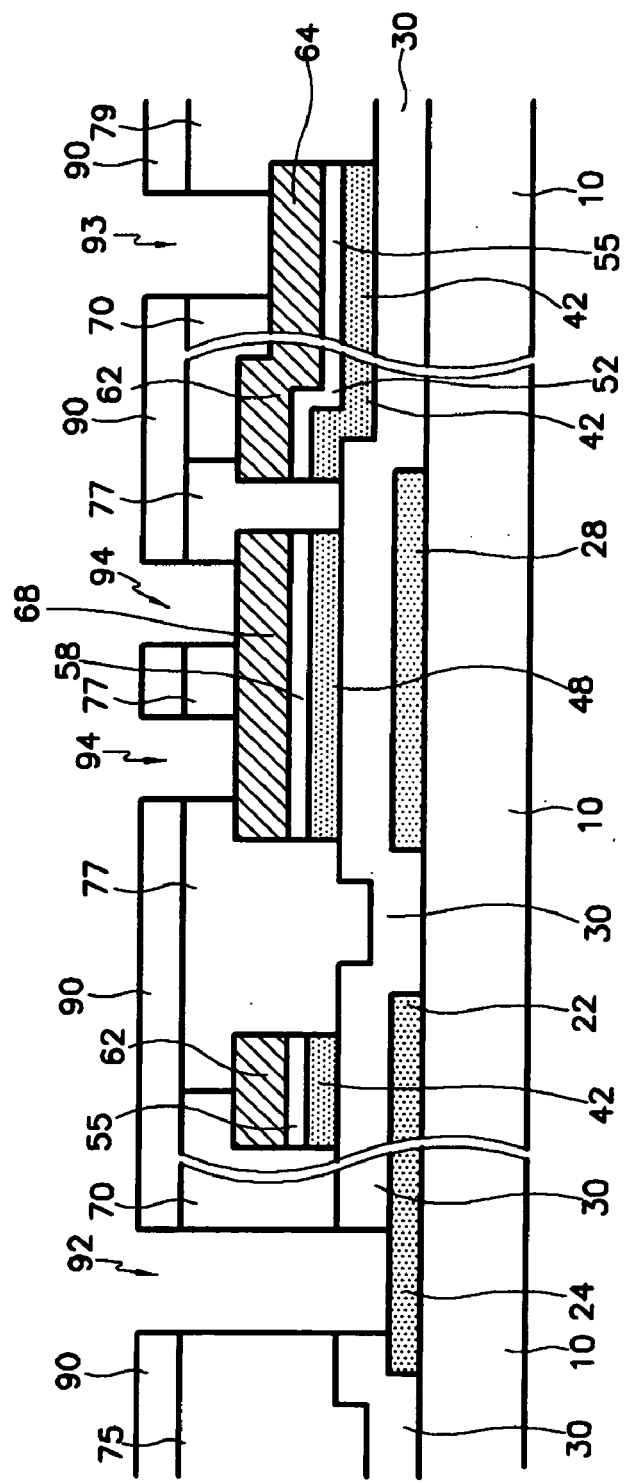
FIGS. 20B and 20C are the cross-sectional views taken along the lines XXB–XXB' and XXC–XXC' of FIG. 20A, respectively.
Figure 20C:
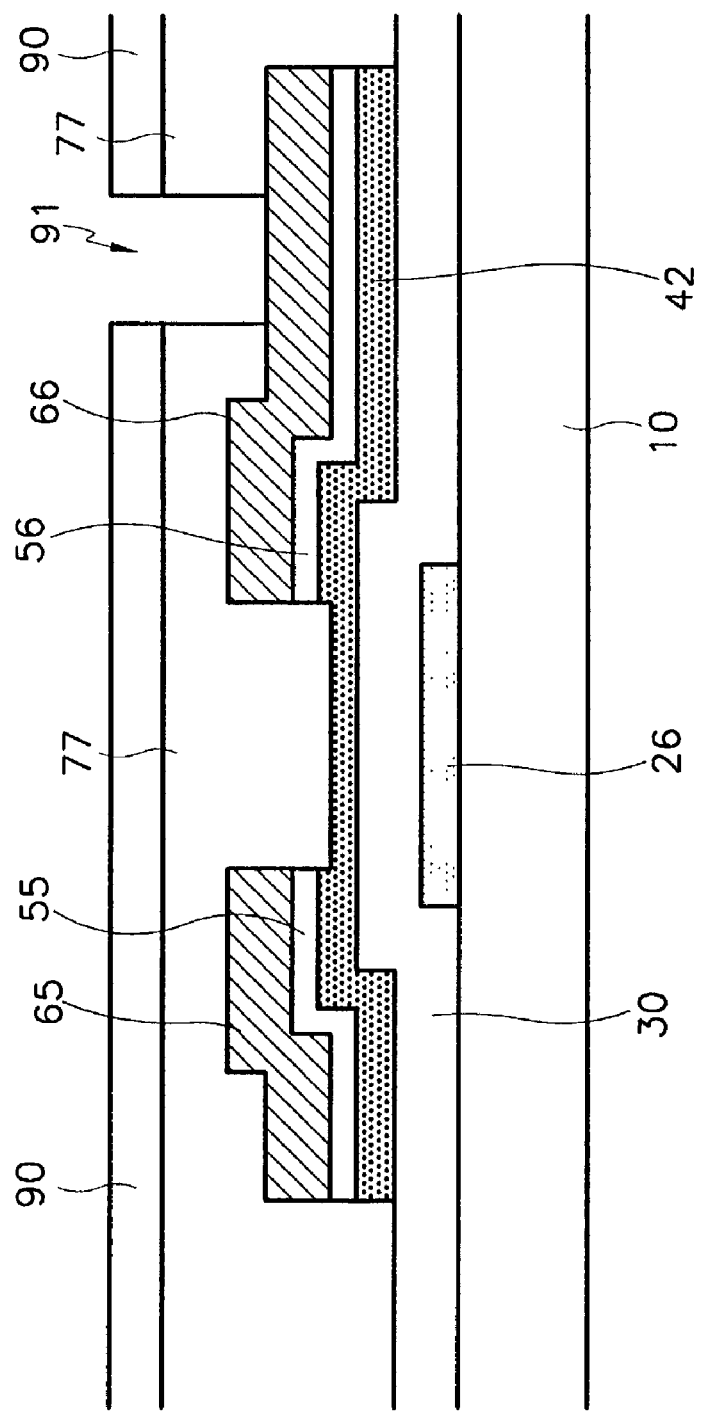

After forming data wire parts 62, 64, 65, 66, and 68, the ohmic contact layer patterns 55, 56, and 58, and the semiconductor patterns 42 and 48 by the above steps, photosensitive photoresist layers including red, green, and blue resins are coated by screen printing or off-set printing, and patterned to form color filters 75, 77, and 79, as shown in FIGS. 20A to 20C.

Next, a passivation layer 90 covering the color filters 75, 77, and 79 is formed on the substrate 10, and exposed and developed along the color filters 75, 77, and 79 through photolithography step using a mask to form contact holes 91, 92, 93, and 94 respectively exposing the drain electrode 66, the gate insulating layer 30 on the gate pad 24, the data pad 64, and the conductor pattern 68 for the storage capacitor. Then, the gate insulating layer 30 that is not covered by the passivation layer 90 is etched to expose the gate pad 24 through the contact hole 92. At this time, it is preferable that the passivation layer 90 is made of organic transparent material having good planarization and photosensitive properties. It may lower the step that forms by the layer to be laid later. The contact holes 91, 92, 93, and 94 may be formed through a photolithography process using only exposure and development by patterning along with the color filters 75, 77, and 79. If the contact holes 91, 92, 93, and 94 may be formed in the step of printing the color filters 75, 77, and 79, the passivation layer 90 may be omitted. As with this embodiment, when forming the passivation layer 90, it is easy to control the thickness of the passivation layer 90 and the color filters 75, 77, and 79, and to form the contact holes 91, 92, 93, and 94 through a photolithography process using only exposure and development. However, the downside of printing method forming the color filters 75, 77, and 79 is a low resolution. The reference number 100 in FIG. 20A indicates the boundary of the color filters 75, 77, and 79. Furthermore, the color filters 75, 77, and 79 may overlap each other.

Next, as shown in FIGS. 14 to 16, an ITO layer is deposited to a thickness of 400 Å to 500 Å, and etched by using a mask to form a pixel electrode 82, a redundant gate pad 84, and a redundant data pad 86.

On the other hand, a light blocking layer to absorb or block light such as ultraviolet rays or visible rays of short-wave lengths, which may reach the channel portion of the thin film transistor from outside, can be formed of color filters without additional steps. It will be described referring to drawings.

Figure 21:
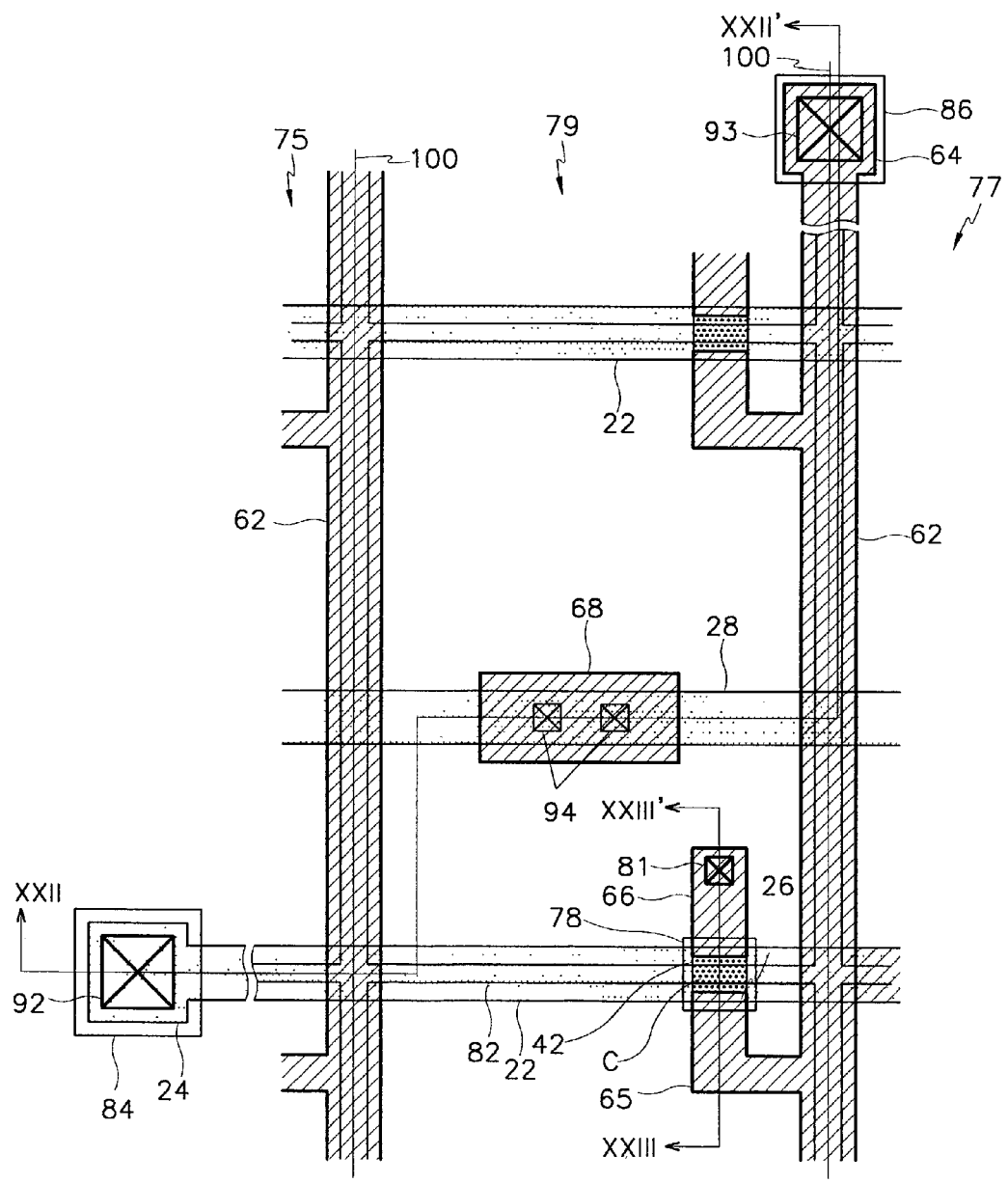
FIG. 21 is a layout view of a thin film transistor array panel for a liquid crystal display according to the third embodiment of the present invention.
Figure 22:
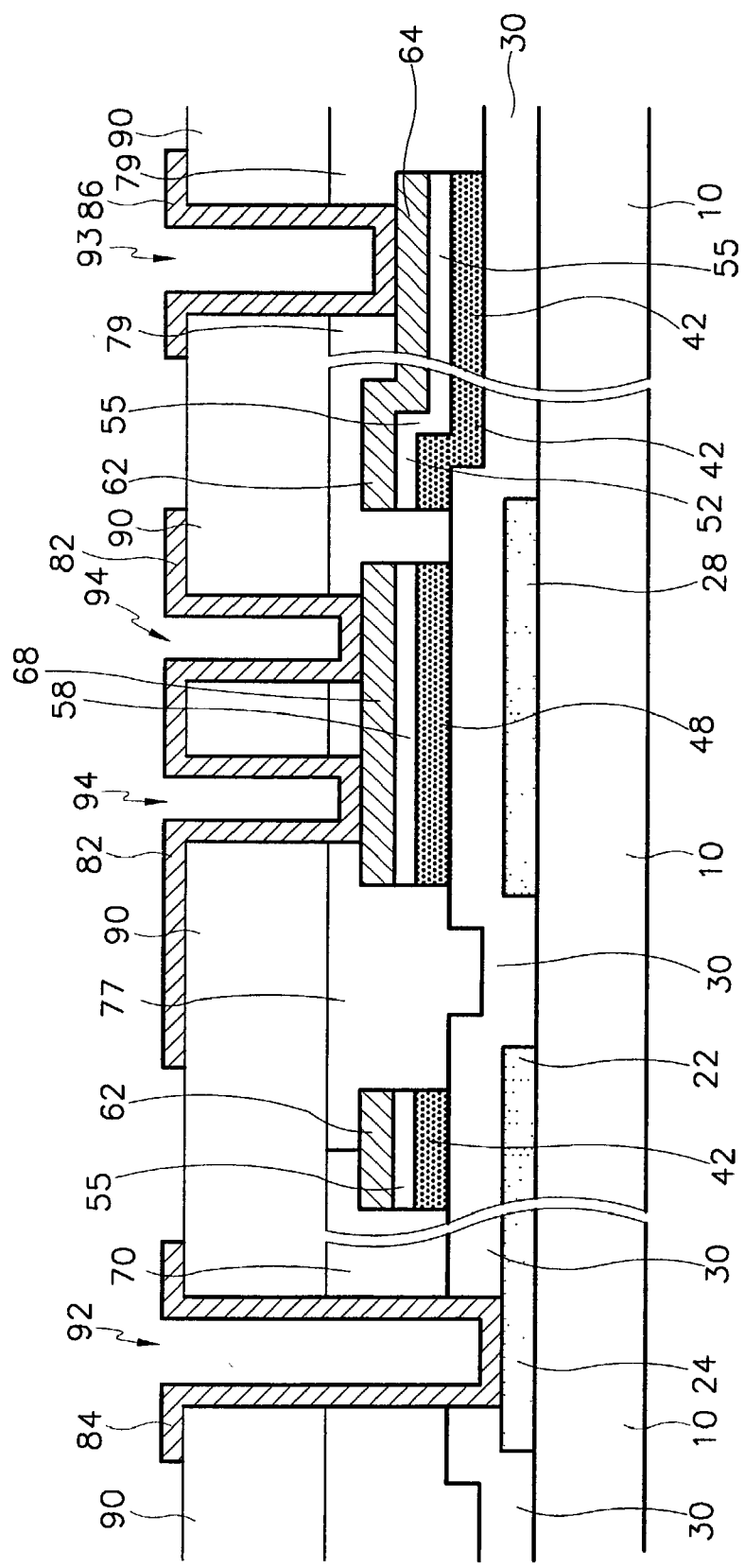
FIGS. 22 and 23 are cross-sectional views taken along lines XXII–XXII' and XXIII–XXIII' of FIG. 21, respectively.
Figure 23:
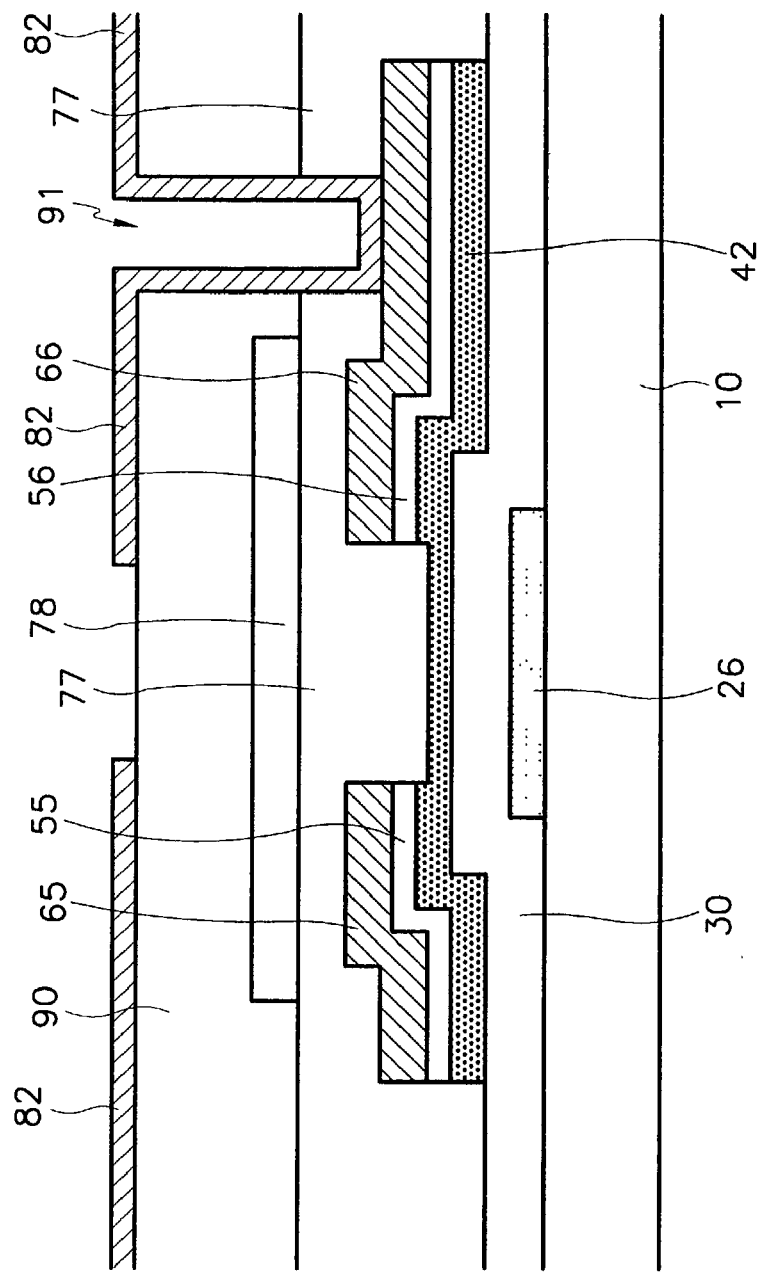

FIG. 21 is a layout view of a thin film transistor array panel for a liquid crystal display according to the third embodiment of the present invention, and FIGS. 22 and 23 are cross-sectional views taken along lines XXII–XXII' and, XXIII–XXIII' of FIG. 21, respectively.

As shown in FIGS. 21 to 23, most of the structure is the same as the second embodiment.

However, a light blocking layer 78 to absorb or block lights such as ultraviolet rays or visible rays of short-wave lengths, which may reach the channel portion C of the thin film transistor from outside, is formed with the same layer as the color filters 75, 77, and 79 over the channel portion C of the thin film transistor. The light blocking layer 78 may be located on or under the color filters 75, 77, and 79 depending on the order how the color filters 75, 77, and 79 are formed. In order to absorb as much lights as possible combing from outside, it is desirable that the light blocking layer has a single-layered or double-layered structure of the red color filter and/or the green color filter, so that the light goes through the red and green color filters. The light blocking layer 78 over the channel portion C, by absorbing or blocking the lights such as ultraviolet rays or visible rays of short-wave lengths, minimizes the leakage current at channel portion of the thin film transistor and improves the display quality.

Most of the manufacturing method according to the third embodiment is similar to the second embodiment.

However, when forming the red, green, blue color filters 75, 77, and 79, the light blocking layer 78 made of the red or green color filters is formed over the channel portion C of the thin film transistor. Here, the light blocking layer 78 may be located on or under the color filters 75, 77, and 79 depending on the order how the color filters 75, 77, and 79 are formed. Also, in order to absorb as much lights as possible, it is desirable that the light, which are incident to the channel portion C of the thin film transistor, goes through the red and green color filters.

Next, like the second embodiment, a passivation layer 90, acrylic organic material covers the color filters 75, 77, and 79, and the light blocking layer 78 is formed on the substrate 10. The passivation layer 90 is patterned, along with the color filters 75, 77, and 79, and the gate insulating layer 30 through photolithography step using a mask to form contact holes 91, 92, 93, and 94 respectively exposing the drain electrode 66, the gate pad 24, the data pad 64, and the conductor pattern 68 for the storage capacitor. It is preferable that the passivation layer 90 is made of material that can be easily planarized to flatten the steps of under-layers and then to minimize alignment distortions of liquid crystal molecules. The reference number 100 in FIG. 21 indicates the boundary of the color filters 75, 77, and 79. Furthermore, the color filters 75, 77, and 79 may overlap each other.

In this embodiment, a buffer insulating layer of such material as silicon nitride may be laid before forming the red, green, blue color filters 75, 77, 79, because it may prevent the channel portion C of the thin film transistor from contaminated by the photosensitive material including resins of the color filters.

Such a thin film transistor panel may be fabricated by many other different ways and involve many other alternative structures.

In this embodiment, the data wire parts, the ohmic contact layer patterns and the semiconductor patterns are formed through a photolithography process using one mask. Also, the gate wire and the data wire, made of photosensitive conductive material, are formed through a photolithography process without an etch step, simplifying the manufacturing process. Also, the methods according to the present invention reduces the number of masks employed in manufacturing a thin film transistor panel for a liquid crystal display and also minimizes the manufacturing costs. Also, the light blocking layer over the channel portion, by blocking or absorbing the lights such as ultraviolet rays or visible rays of short-wave lengths, which are incident to the channel portion C, minimizes the leakage current in channel portion of the thin film transistor and improves the display quality.

In the drawings and specification, there have been disclosed typical preferred embodiments of the present invention and, although specific terms are employed, they are used in a generic and descriptive sense only and not for purposes of limitation, the scope of the invention being set forth in the following claims.

What is claimed is:

1. A thin film transistor array panel for a liquid crystal display, comprising:
   a gate wire including a gate line and a gate electrode connected to the gate line, and formed on an insulating substrate;
   a gate insulating layer covering the gate electrode;
   a semiconductor pattern formed on the gate insulating layer;
   a data wire including a source electrode and a drain electrode, and a data line connected to the source electrode;
   a passivation layer covering the data wire and having a first contact hole exposing the drain electrode; and
   a pixel electrode connected to the drain electrode through the first contact hole,
   wherein the gate wire or the data wire are made of photodefinable conductive material.

2. The thin film transistor array panel of claim 1, further comprising red, green, and blue color filters formed under the passivation layer.

3. The thin film transistor array panel of claim 2, wherein the passivation layer and the color filters are made of photosensitive material.

4. The thin film transistor array panel of claim 3, wherein the photodefinable conductive material is made of Ag paste or copper organic metal that includes photoresist.

5. A thin film transistor array panel for a liquid crystal display, comprising:
   a plurality of gate lines formed on an insulating substrate;
   a gate insulating layer covering the gate lines;
   a plurality of data lines intersecting the gate lines;
   an amorphous silicon layer formed under the entire data lines;
   an ohmic contact layer interposed between the data lines and the amorphous silicon layer;
   an array of thin film transistors, each transistor including a gate electrode connected to the gate line, a source electrode connected to the data line, and a drain electrode;
   a plurality of color filters formed over the gate insulating layer, the color filters overlapping the data lines at least in part; and
   a plurality of pixel electrodes formed on the color filters, each pixel electrode electrically connected to the drain electrode.

6. The thin film transistor array panel of claim 5, wherein each of the pixel electrodes overlaps at least one of the data lines a least in part.

7. The thin film transistor array panel of claim 5, further comprising a storage electrode made of the same layer as the gate lines.

8. The thin film transistor array panel of claim 7, further comprising a conductor pattern overlapping the storage electrode, the conductor pattern made of the same layer as the data lines.

9. The thin film transistor array panel of claim 5, wherein adjacent two of the color filters overlap each other at least in part.

10. The thin film transistor array panel of claim 5, further comprising an insulating layer interposed between the color filters and the pixel electrodes.

11. The thin film transistor array panel of claim 5, further comprising a storage electrode made of the same layer as the gate lines.

12. The thin film transistor array panel of claim 11, further comprising a conductor pattern overlapping the storage electrode, the conductor pattern made of the same layer as the data lines.

13. A thin film transistor array panel for liquid crystal display, comprising:
- a plurality of gate lines formed on an insulating substrate;
- a first insulating layer covering the gate lines;
- a plurality of data lines intersecting the gate lines;
- an amorphous silicon layer formed under the entire data lines;
- an ohmic contact layer interposed between the data lines and the amorphous silicon layer;
- an array of thin film transistors, each transistor including a gate electrode connected to the gate line, a source electrode connected to the data line, and a drain electrode;
- a second insulating layer formed at least on the data lines, the second insulating layer contacting a portion of the amorphous silicon layer exposed between the source electrode and the drain electrode; and
- a plurality of pixel electrodes formed on the second insulating layer, each pixel electrode electrically connected to the drain electrode.

14. The thin film transistor array panel of claim 13, wherein each of the pixel electrodes overlaps at least one of the data lines at least in part.

15. The thin film transistor array panel of claim 13, wherein said second insulating layer has a contact hole exposing a portion of one of the data lines near an end of the one of the data lines.

16. The thin film transistor array panel of claim 15, further comprising a redundant data pad contacting the exposed portion of the data lines through the contact hole.

17. The thin film transistor array panel of claim 15, wherein the redundant data pad is made of the same layer as the pixel electrodes.

18. The thin film transistor array panel of claim 13, wherein said first insulating layer and said second insulating layer has a contact hole exposing a portion of one of the gate lines near an end of the one of the gate lines.

19. The thin film transistor array panel of claim 18, further comprising a redundant gate pad contacting the exposed portion of the gate lines through the contact hole.

20. The thin film transistor array panel of claim 19, wherein the redundant gate pad is made of the same layer as the pixel electrodes.

21. The thin film transistor array panel of claim 18, wherein the gate lines include double layers.

22. The thin film transistor array panel of claim 21, wherein the gate lines include a lower layer and an upper layer, and the lower layer has resistivity lower than the upper layer.

23. The thin film transistor array panel of claim 22, wherein the lower layer is made of Al or Al alloy.

24. The thin film transistor array panel of claim 21, wherein the gate lines include a lower layer and an upper layer having resistivity lower than the lower layer.

25. The thin film transistor array panel of claim 24, wherein the upper layer is made of Al or Al alloy.

* * * * *